United States Patent
Haeberlen et al.

(10) Patent No.: US 8,946,767 B2
(45) Date of Patent: *Feb. 3, 2015

(54) MONOLITHIC SEMICONDUCTOR SWITCHES AND METHOD FOR MANUFACTURING

(75) Inventors: Oliver Haeberlen, Villach (AT); Walter Rieger, Arnoldstein (AT); Martin Vielemeyer, Villach (AT); Lutz Goergens, Villach (AT); Martin Poelzl, Ossiach (AT); Milko Paolucci, Villach (AT); Johannes Schoiswohl, San Jose, CA (US); Joachim Krumrey, Goedersdorf (AT); Sonja Krumrey, legal representative, Goedersdorf (AT)

(73) Assignee: Infineon Technologies Austria AG, Villach (AT)

( * ) Notice: Subject to any disclaimer, the term of this patent is extended or adjusted under 35 U.S.C. 154(b) by 211 days.

This patent is subject to a terminal disclaimer.

(21) Appl. No.: 13/487,999

(22) Filed: Jun. 4, 2012

(65) Prior Publication Data

US 2013/0140673 A1    Jun. 6, 2013

Related U.S. Application Data

(63) Continuation of application No. 13/081,642, filed on Apr. 7, 2011, now Pat. No. 8,193,559, which is a continuation-in-part of application No. 12/360,263, filed on Jan. 27, 2009, now Pat. No. 7,943,955.

(51) Int. Cl.
*H01L 29/66* (2006.01)
*H01L 29/417* (2006.01)
(Continued)

(52) U.S. Cl.
CPC ........ *H01L 23/495* (2013.01); *H01L 29/66734* (2013.01); *H01L 2924/01005* (2013.01);
(Continued)

(58) Field of Classification Search
CPC ............................. H01L 23/495; H01L 28/40
USPC ......................................... 257/124, 428, 773
See application file for complete search history.

(56) References Cited

U.S. PATENT DOCUMENTS 5,719,487 A    2/1998 Sato et al.
5,753,529 A    5/1998 Chang et al.
(Continued)

FOREIGN PATENT DOCUMENTS

DE    102005046624    3/2007
WO    2007024022    3/2007

OTHER PUBLICATIONS

Office Action mailed Mar. 23, 2010 for U.S. Appl. No. 12/360,263.
(Continued)

*Primary Examiner* — Jarrett Stark
(74) *Attorney, Agent, or Firm* — Dicke, Billig & Czaja, PLLC

(57) ABSTRACT

A semiconductor device and method are disclosed. One embodiment provides a semiconductor die with a first n-type channel FET and a second n-type channel FET. A source of the first n-type channel FET and a drain of the second n-type channel FET are electrically coupled to at least one contact area at a first side. A drain of the first n-type channel FET, a gate of the first n-type channel FET, a source of the second n-type channel FET and the gate of the second n-type channel FET are electrically coupled to contact areas at a second side. Contact areas of the first n-type channel FET and the second n-type channel FET are electrically separated from each other.

4 Claims, 26 Drawing Sheets

(51) Int. Cl.

| | | |
|---|---|---|
| *H01L 29/78* | (2006.01) | |
| *H01L 21/8238* | (2006.01) | |
| *H01L 49/02* | (2006.01) | |
| *H01L 23/492* | (2006.01) | |
| *H01L 23/00* | (2006.01) | |
| *H01L 23/495* | (2006.01) | |
| *H01L 27/092* | (2006.01) | |
| *H01L 27/088* | (2006.01) | |
| H01L 21/8234 | (2006.01) | |
| H01L 29/08 | (2006.01) | |
| H01L 29/41 | (2006.01) | |
| H01L 29/06 | (2006.01) | |
| H01L 29/04 | (2006.01) | |
| H01L 29/40 | (2006.01) | |

(52) U.S. Cl.
CPC ... *H01L29/4175* (2013.01); *H01L 2924/13064* (2013.01); *H01L 29/781* (2013.01); *H01L 2224/73219* (2013.01); *H01L 21/823487* (2013.01); *H01L 21/823871* (2013.01); *H01L 21/823885* (2013.01); *H01L 28/40* (2013.01); *H01L 2924/01015* (2013.01); *H01L 29/7809* (2013.01); *H01L 21/823475* (2013.01); *H01L 2924/30105* (2013.01); *H01L 21/823418* (2013.01); *H01L 29/0856* (2013.01); *H01L 29/7806* (2013.01); *H01L 2924/01014* (2013.01); *H01L 2224/73221* (2013.01); *H01L 29/7827* (2013.01); *H01L 29/7835* (2013.01); *H01L 29/7803* (2013.01); *H01L 23/492* (2013.01); *H01L 2924/01029* (2013.01); *H01L 29/41* (2013.01); *H01L 24/73* (2013.01); *H01L 23/49524* (2013.01); *H01L 29/0653* (2013.01); *H01L 29/41766* (2013.01); *H01L 2924/10329* (2013.01); *H01L 2224/40247* (2013.01); *H01L 2924/01033* (2013.01); *H01L 2924/00014* (2013.01); *H01L 2924/13091* (2013.01); *H01L 2224/48091* (2013.01); *H01L 2924/19041* (2013.01); *H01L 29/7813* (2013.01); *H01L 29/7811* (2013.01); *H01L 24/40* (2013.01); *H01L 2924/01082* (2013.01); *H01L 27/0922* (2013.01); *H01L 2924/19043* (2013.01); *H01L 2924/014* (2013.01); *H01L 27/088* (2013.01); *H01L 24/41* (2013.01); *H01L 29/41741* (2013.01); *H01L 2924/01023* (2013.01); *H01L 2924/01006* (2013.01); *H01L 23/49562* (2013.01); *H01L 24/48* (2013.01); *H01L 2924/30107* (2013.01); *H01L 2224/48247* (2013.01); *H01L 29/04* (2013.01); *H01L 29/407* (2013.01); *H01L 2924/13062* (2013.01); *H01L 27/092* (2013.01); *H01L 21/823814* (2013.01)
USPC .......................... 257/124; 257/773; 257/428

(56) References Cited

U.S. PATENT DOCUMENTS

| | | |
|---|---|---|
| 5,841,197 A | 11/1998 | Adamic |
| 6,063,678 A | 5/2000 | D'Anna |
| 6,239,463 B1 | 5/2001 | Williams et al. |
| 6,420,775 B1 | 7/2002 | Asai |
| 6,521,923 B1 | 2/2003 | D'Anna et al. |
| 7,041,576 B2 | 5/2006 | Pozder et al. |
| 7,227,198 B2 | 6/2007 | Pavier et al. |
| 7,291,884 B2 | 11/2007 | Darwish et al. |
| 2004/0173846 A1 | 9/2004 | Hergenrother et al. |
| 2006/0231904 A1 | 10/2006 | Kocon |
| 2007/0034942 A1 | 2/2007 | Xu et al. |
| 2008/0061368 A1 | 3/2008 | Williams et al. |
| 2008/0252372 A1 | 10/2008 | Williams |
| 2008/0311862 A1 | 12/2008 | Spina et al. |
| 2009/0258472 A1 | 10/2009 | Florian et al. |

OTHER PUBLICATIONS

Final Office Action mailed Jul. 9, 2010 for U.S. Appl. No. 12/360,263.
Office Action mailed Nov. 3, 2011 for U.S. Appl. No. 13/081,642.

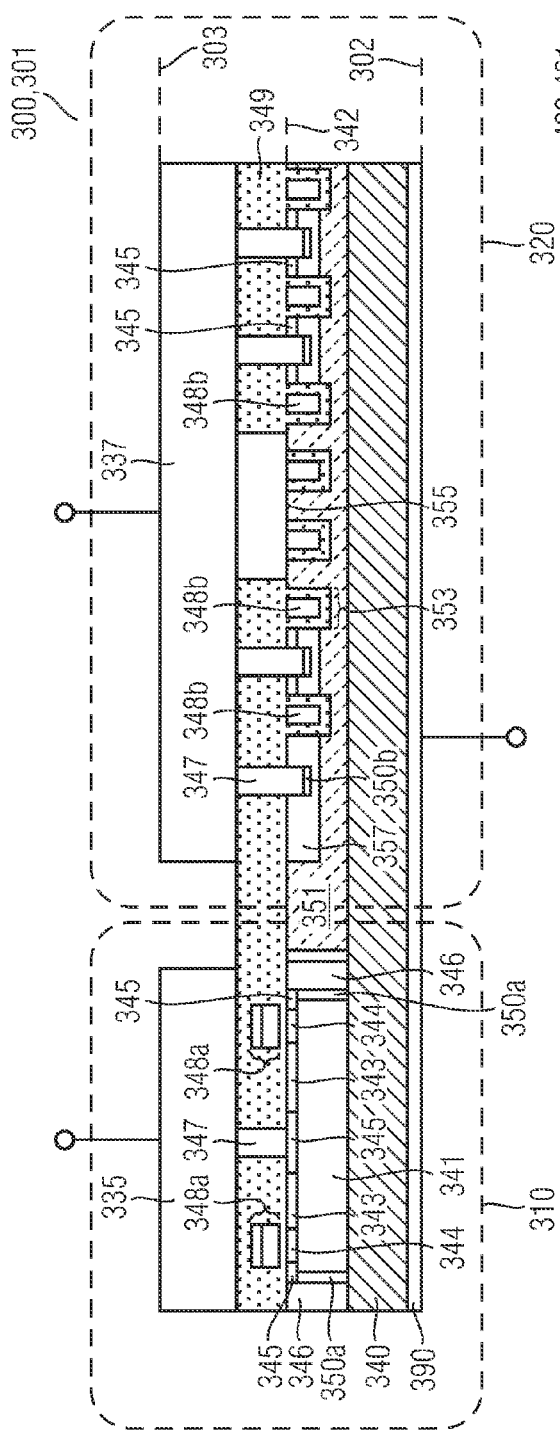
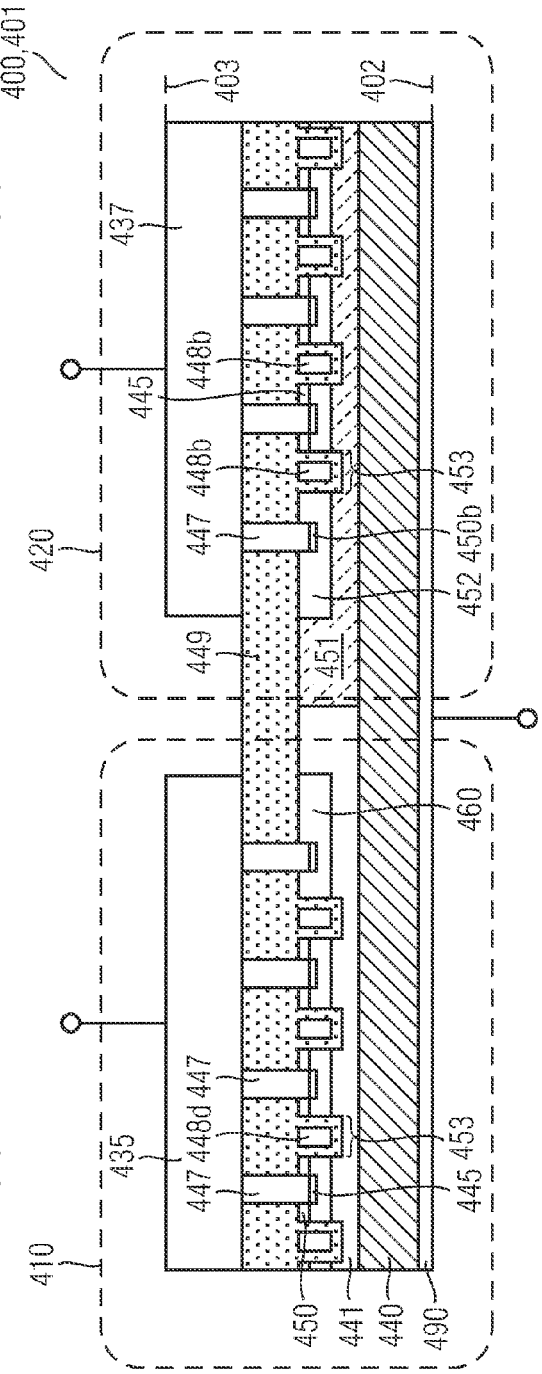
FIG 3
FIG 4

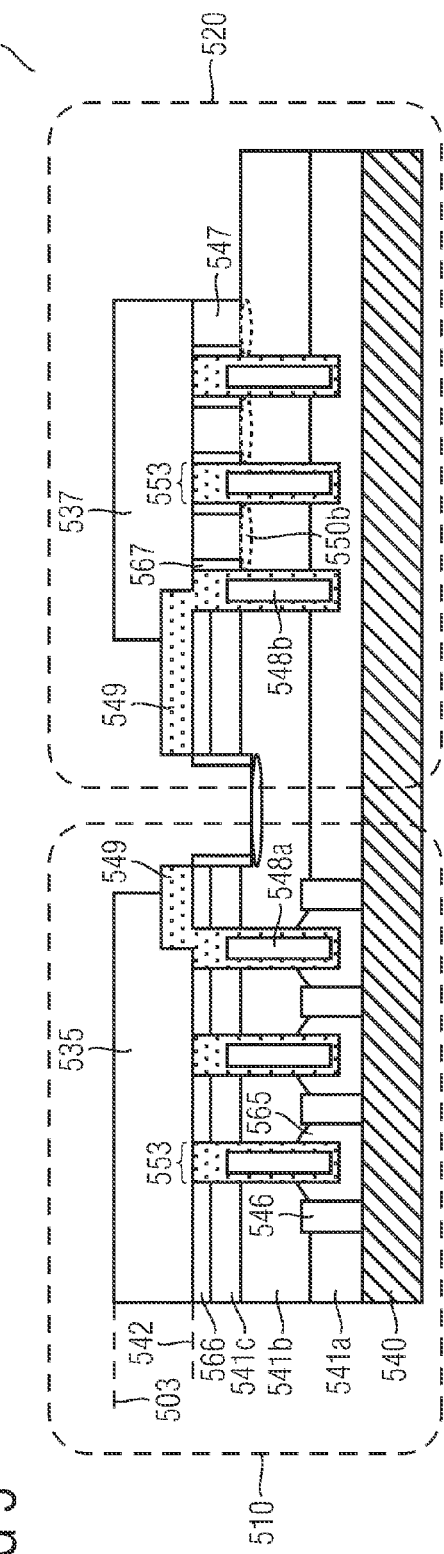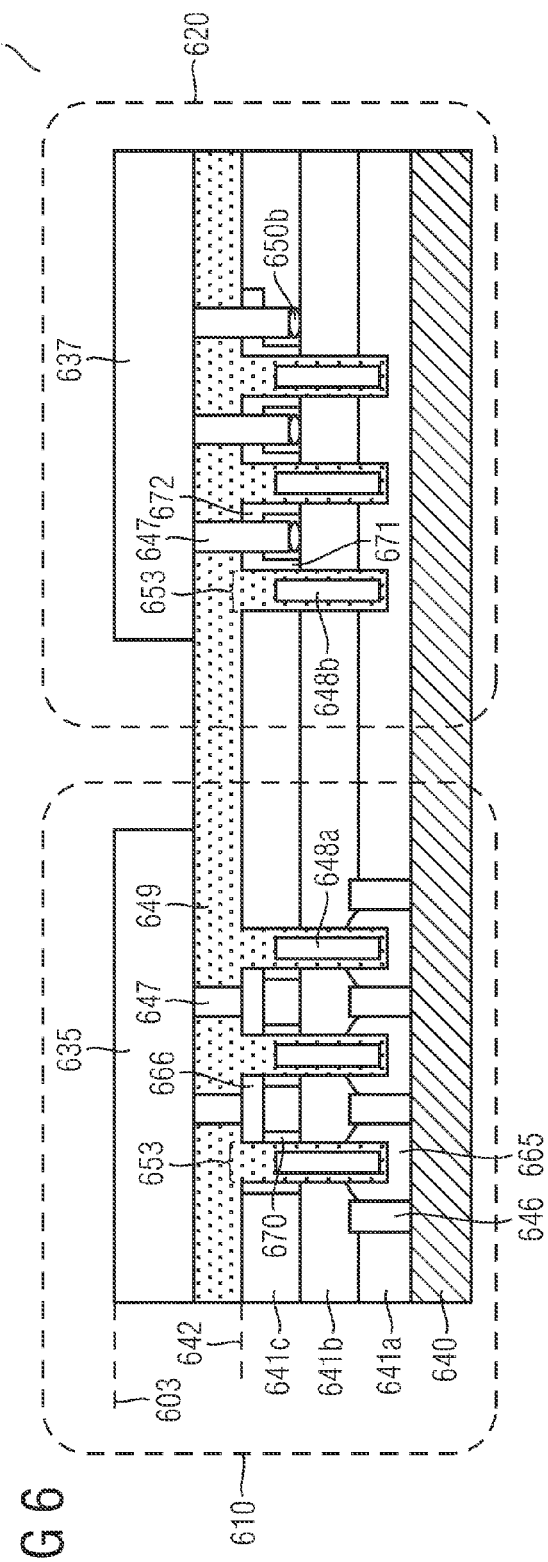

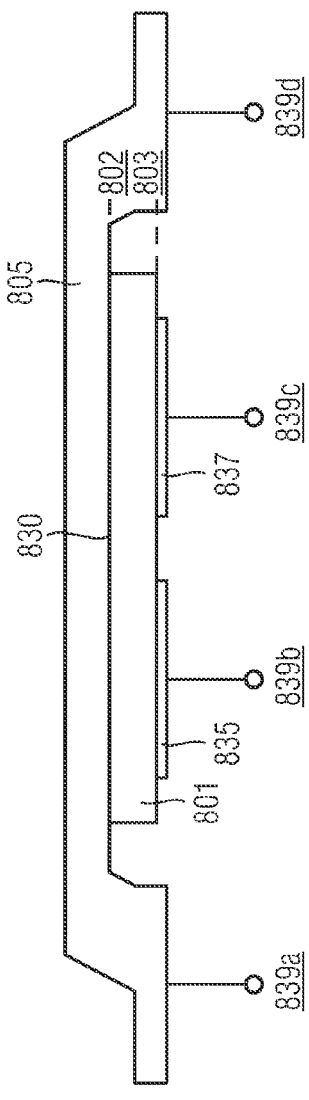
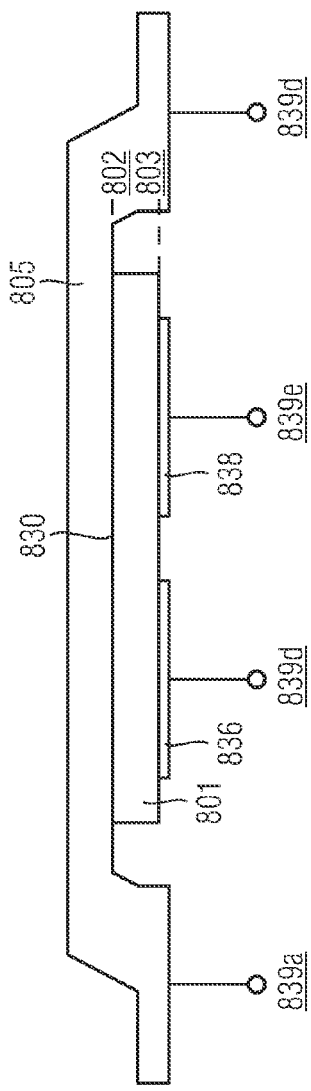

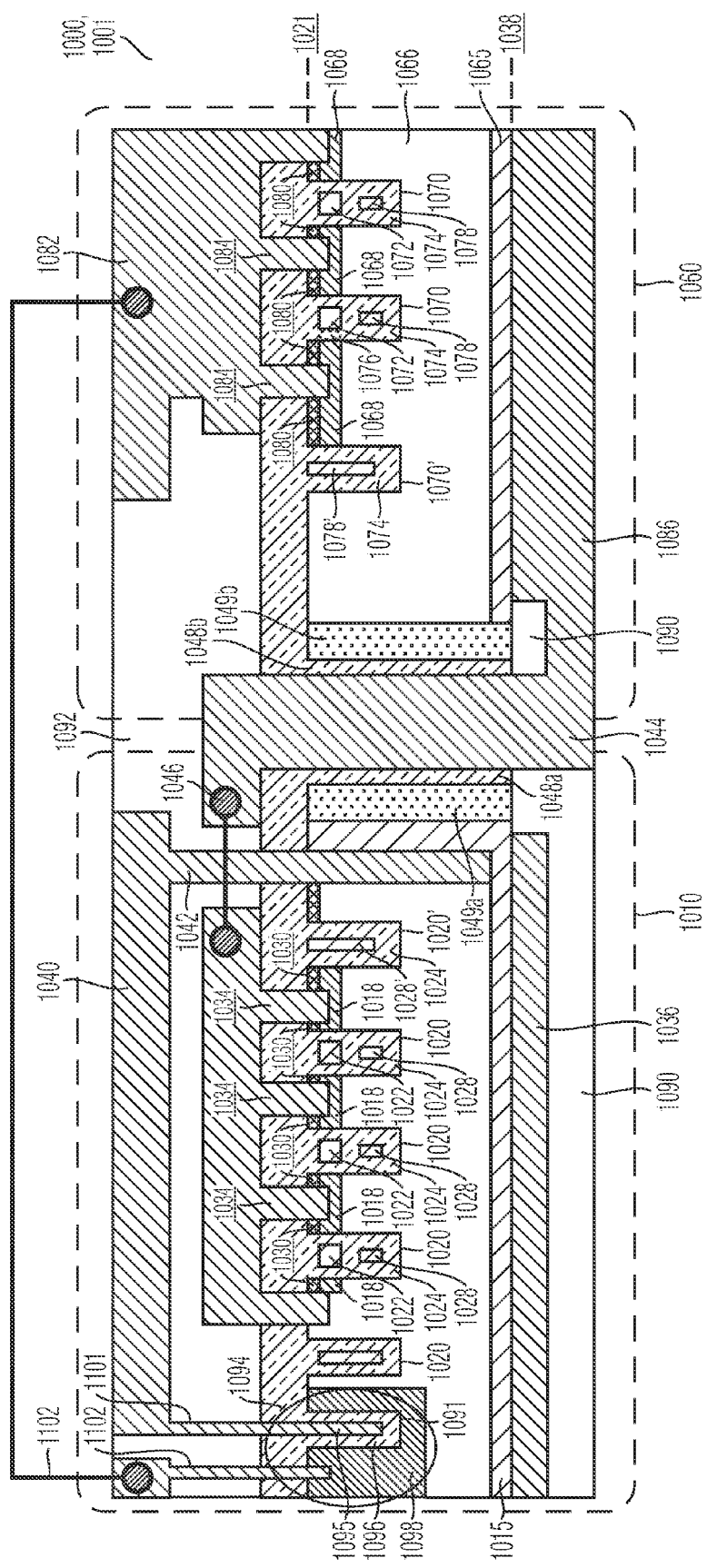

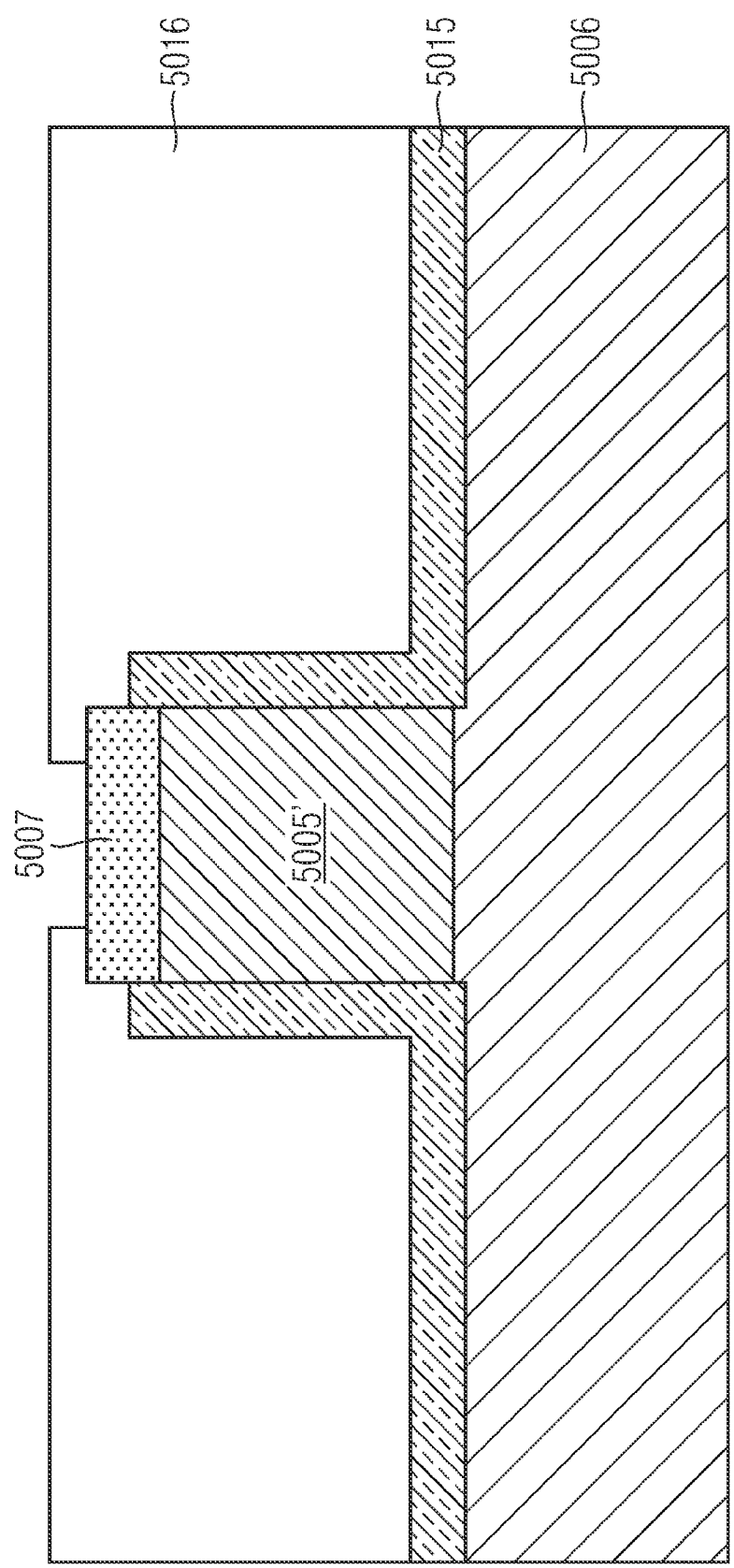

US 8,946,767 B2

MONOLITHIC SEMICONDUCTOR SWITCHES AND METHOD FOR MANUFACTURING

CROSS REFERENCE TO RELATED APPLICATIONS

This application is a continuation of U.S. patent application Ser. No. 13/081,642, filed Apr. 7, 2011, entitled "Monolithic Semiconductor Switches and Method for Manufacturing," which is a continuation-in-part of U.S. patent application Ser. No. 12/360,263, filed Jan. 27, 2009, entitled "Monolithic Semiconductor Switches and Method for Manufacturing," which are incorporated herein by reference.

BACKGROUND

Field effect transistors (FETs) are included in semiconductor chips of a vast variety of semiconductor device applications. For example, in motor drivers, DC-converters and rectifiers, FETs are used as semiconductor switches in half-bridge configuration including a low-side switch and a high-side switch. In view of further developments of these applications, there is a need for increasing the integration level while ensuring appropriate device characteristics.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3 illustrates a schematic view of a portion of a semiconductor device including an n-type lateral DMOS high-side switch and an n-type trench DMOS low-side switch having a Schottky contact area within a cell array of the low-side switch according to one embodiment.

FIG. 4 illustrates a schematic cross-sectional view of a portion of a semiconductor device including a p-type trench MOSFET high-side switch and an n-type trench MOSFET low-side switch according to one embodiment.

FIG. 5 illustrates a simplified cross-sectional view of a portion of a semiconductor device including an n-type trench MOSFET high-side switch and an n-type trench MOSFET low-side switch with n-type polysilicon spacers according to one embodiment.

FIG. 6 illustrates a schematic cross-sectional view of a portion of a semiconductor device including an n-type trench MOSFET high-side switch and an n-type trench MOSFET low-side switch with n-type semiconductor zones adjoining sidewalls of the trenches, respectively, according to one embodiment.

FIG. 8B illustrates a schematic cross-sectional view of the semiconductor device illustrated in FIG. 8A along a cut line AA'.

FIG. 8C is a schematic cross-sectional view of the semiconductor device illustrated in FIG. 8A along a cut line BB'.

FIG. 8D is a simplified plan view of a printed circuit board (PCB) having the semiconductor device of FIG. 8A mounted thereon as well as an input capacitance.

FIG. 21 illustrates the device of FIG. 17 supplemented with a trench capacitor.

FIGS. 22A to 22F illustrate schematic cross-sectional views of one semiconductor die for illustrating a method of manufacturing a semiconductor device including a first n-type channel FET and a second n-type channel FET in half-bridge configuration in accordance with one embodiment.

DETAILED DESCRIPTION

Figure 1:
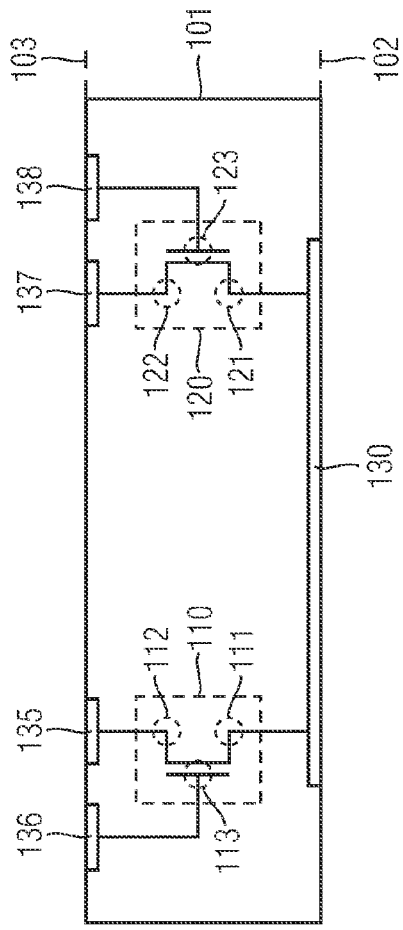
FIG. 1 illustrates a simplified view of a portion of a semiconductor device including a first FET as a high-side switch and a second FET as a low-side switch according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In the following embodiments of the semiconductor device and manufacturing method are described in connection with the Figures.

One embodiment of a semiconductor device described herein includes one semiconductor die with a first and a second FET, wherein one of source/drain of the first FET and one of source/drain of the second FET are electrically coupled to at least one contact area at a first side of one semiconductor die, respectively. The other one of source/drain of the first FET, a gate of the first FET, the other one of source/drain of the second FET and the gate of the second FET are electrically coupled to contact areas at a second side of the one semiconductor die opposite to the first side, respectively. The contact areas of the other one of source/drain of the first FET, of the gate of the first FET, of the other one of source/drain of the second FET and of the gate of the second FET are electrically separated from each other, respectively.

The above and still further features and advantages of embodiments will become apparent upon consideration of the following definitions, descriptions and descriptive features, wherein like reference numerals in the various Figures are utilized to designate like components. While these descriptions go into specific details, it should be understood that variations may and do exist and would be apparent to those skilled in the art based on the descriptions herein.

FIG. 1 schematically illustrates a portion of a semiconductor device 100 including one semiconductor die 101. The one semiconductor die 101 includes a first FET 110 and a second FET 120, wherein one connection 111 of source/drain of the first FET 110 and one connection 121 of source/drain of the second FET 120 are electrically coupled to a contact area 130 at a first side 102 of the one semiconductor die 101, respectively. The other connection 112 of source/drain of the first FET 110, a gate 113 of the first FET 110, the other one connection 122 of the second FET 120 and the gate 123 of the second FET 120 are electrically coupled to contact areas 135, 136, 137, 138 at a second side 103 of the one semiconductor die 101 opposite to the first side 102, respectively. The contact areas 135, 136, 137, 138 of the other one connection 112 of source/drain of the first FET 110, of the gate 113 of the first FET 110, of the other one connection 122 of the second FET 120 and of the gate 123 of the second FET 120 are electrically separated from each other, respectively. Thus, the first FET 110 and the second FET 120 are monolithically integrated in the one semiconductor die 101 forming a half-bridge configuration.

The one semiconductor die 101 may include a semiconductor substrate, which may be, by way of example, a silicon substrate such as a single-crystalline or multi-crystalline silicon substrate, a SiGe substrate, a SiC substrate or a substrate of a semiconductor compound such as A(III)-B(V), e.g., GaAs or GaN. The one semiconductor die 101 may further include epitaxial semiconductor layers as well as doped and undoped portions, conductive structures, components, devices and insulating structures which have previously been fabricated. The doped portions may be formed by ion implantation and subsequent annealing or by diffusion, for example. In one embodiment, the only semiconductor elements of the one semiconductor die 101 are the first FET 110 and the second FET 120 in a half-bridge configuration. According to another embodiment, the one semiconductor die 101 includes, apart from the first FET 110 and the second FET 120, further semiconductor elements and devices such as resistors, capacitors, bipolar transistors, diodes, for example. These further semiconductor elements and devices may constitute a monolithically integrated driver IC for the first and second FET. By way of example, the contact areas 136, 137 of the first and second FET may be contact plugs electrically connected to the driver IC, respectively, by conductive elements such as metal lines, for example.

The first FET 110 and/or the second FET 120 may be a lateral FET or a vertical FET such as a trench FET, for example. The first FET 110 and/or the second FET 120 may be of p-type or n-type. By way of example, the first FET 110 and/or the second FET 120 may be a Metal Insulator Semiconductor FET (MISFET) such as a Metal Oxide Semiconductor FET (MOSFET), a Junction FET (JFET) or a High Electron Mobility Transistor (HEMT), e.g., a HEMT based on InGaAs/InP/AlInAs, AlGaN/GaN and Si/SiGe hetero structures.

In the embodiment illustrated in FIG. 1, the one connection 111 of source/drain of the first FET 110 and the one connection 121 of source/drain of the second FET 120 are interconnected at the first side 102 by a single contact area 130. According to another embodiment, the one connection 111 of source/drain of the first FET 110 and the one connection 121 of source/drain of the second FET 120 may be electrically coupled to separate contact areas at the first side 102. These separate contact areas may be interconnected, i.e. electrically coupled, by mounting the first side 102 of the one semiconductor die 101 on a lead frame.

The semiconductor device 100 may also include a second or further semiconductor dies such as driver ICs, for example. These further semiconductor dies may be electrically coupled to the one semiconductor die within a common package, e.g. by bond wires.

Figure 2:
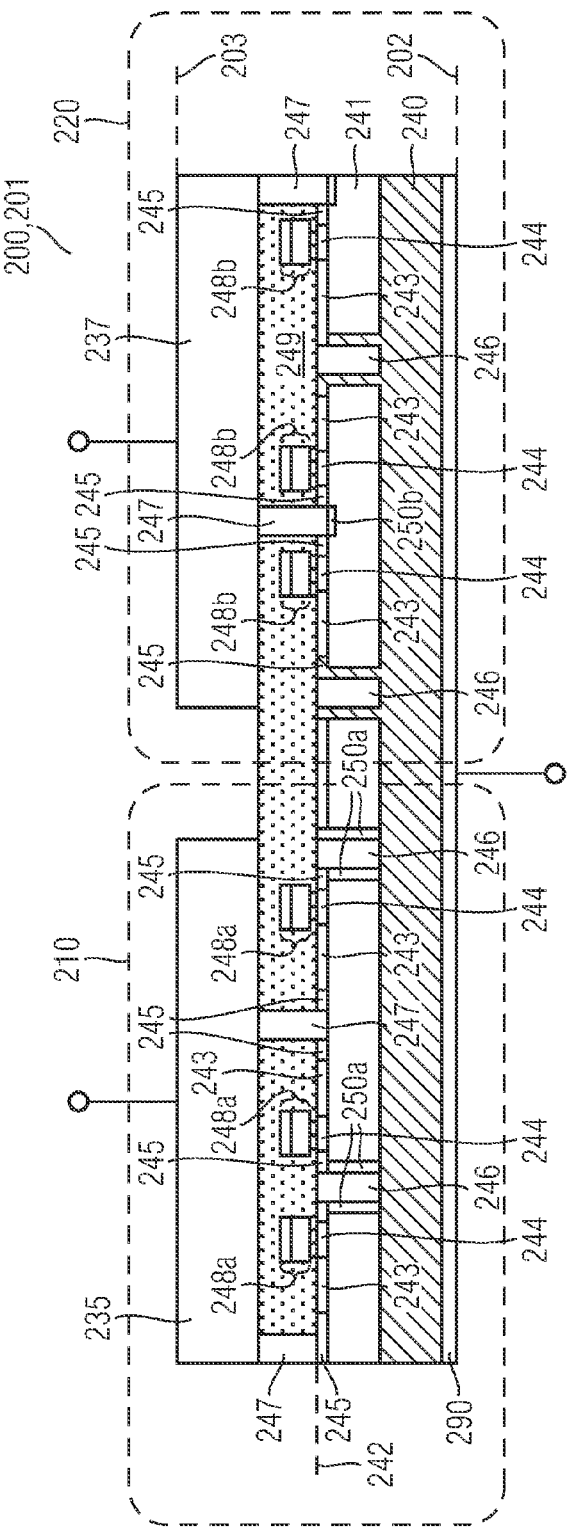
FIG. 2 illustrates a schematic view of a portion of a semiconductor device including an n-type lateral DMOS (Double-Diffused Metal Oxide Semiconductor) high-side switch and an n-type lateral DMOS low-side switch.

FIG. 2 refers to a schematic cross-sectional view of a portion of a semiconductor device 200 including one semiconductor die 201, the one semiconductor die 201 including a first n-type lateral DMOS 210 and a second n-type lateral DMOS 220 in half-bridge configuration. The one semiconductor die 201 includes an n$^+$-type semiconductor substrate 240 such as an n$^+$-type silicon substrate and a p-type epitaxial layer 241 formed on the n$^+$-type semiconductor substrate 240. The p-type epitaxial layer 241 constitutes a body region in both the first n-type lateral DMOS 210 and the second n-type lateral DMOS 220. At a first side 242 of the p-type epitaxial layer 241, semiconductor regions such as n-type drain extension regions 243, p-type regions 244 used as channel regions, n$^+$-type regions 245 used as source regions are formed within the p-type epitaxial layer 241. In the first n-type lateral DMOS 210 conductive plugs 246 electrically couple the n$^+$-type semiconductor substrate 240 to the n-type drain extension regions 243 formed at a first side 242 of the p-type epitaxial layer 241. The n$^+$-type regions 245 of the second n-type lateral DMOS 220 are electrically coupled to the semiconductor substrate 214 by the conductive plugs 246 such as C-plugs 246 (carbon) extending through the p-type epitaxial layer 241. Thus, a source of the first n-type lateral DMOS 210 and a drain of the second n-type lateral DMOS 220 are electrically coupled via the n$^+$-type semiconductor substrate 240 at a first side 202 of the one semiconductor die 201. At the first side 202, a metal layer or a metal layer stack may be formed on the n$^+$-type semiconductor substrate 240. A half-bridge configuration of the first n-type lateral DMOS 210 as a high-side switch and the second n-type lateral DMOS 220 as a low-side switch may thus be achieved.

A drain of the first n-type lateral DMOS 210 is electrically coupled to a contact area 235 at a second side 203 of the one semiconductor die 201 opposite to the first side 202 via second conductive plugs 247. The n$^+$-type regions 245, i.e. source regions, of the second n-type lateral DMOS 220 are electrically coupled to a contact area 237 at the second side 203 of the one semiconductor die 201 via the second conductive plugs 247.

Gate regions 248a of the first n-type lateral DMOS 210 surrounded by an isolation structure 249 are electrically coupled to a contact area at the second side 203 of the one semiconductor die 201 (not illustrated in FIG. 2). Gate regions 248b of the second n-type lateral DMOS 220 are also electrically coupled to a contact area at the second side 203 of the one semiconductor die 201 (not illustrated in FIG. 2). The contact area of the gate regions 248a of the first lateral DMOS 210, the contact area of the gate regions 248b of the second lateral DMOS 220 and the contact areas 235 and 237 are electrically separated from each other, respectively.

A body region of the first lateral DMOS 210 being part of the p-type epitaxial layer 241 may be connected to the n$^+$-type semiconductor substrate 240 via a p$^+$-type region 250a adjoining the conductive plugs. The body region of the second lateral DMOS 220 being part of the p-type epitaxial layer 241 may be connected to the contact region 237 via the second conductive plugs 247 and a p$^+$-type region 250b formed within the p-type epitaxial layer 241.

FIG. 3 illustrates a schematic cross-sectional view of a portion of a semiconductor device 300 including one semiconductor die 301, the one semiconductor die 301 including an n-type lateral DMOS 310 and an n-type trench FET 320 in half-bridge configuration.

Similar to the embodiment illustrated in FIG. 2, the one semiconductor die 301 includes an n$^+$-type semiconductor substrate 340 and a p-type epitaxial layer 341 formed thereon. Similar to the first n-type lateral DMOS 210 illustrated in FIG. 2, the n-type lateral DMOS 310 includes n-type drain extension regions 343, p-type regions 344 used as channel regions, n$^+$-type regions 345 used as source regions, first and second conductive plugs 346, 347, p$^+$-type semiconductor regions 350a adjoining the conductive plugs 346, gate regions 348a and a contact region 335 at a second side 303 of the one semiconductor die 301.

The n-type trench FET 320 includes an n-type well region 351 as a drain formed within the p-type epitaxial layer 341 as well as a p-type body region 352 formed within the p-type epitaxial layer 341. Trenches 353 extend from a first side 342 of the p-type epitaxial layer 341 through the p-type body region 352 into the n-type well region 351. Within the trenches 353, gate regions 348b as well as part of an insulation structure 349 are formed. N$^+$-type source regions 345 are electrically coupled to a contact area 347 at the second side 303 of the one semiconductor die 301 via the second conductive plugs 347. The p-type body region 352 is also electrically coupled to the contact area 337 via p$^+$-type regions 350b and the second conductive plugs 347. The gate regions 348a, 348b may be connected as described in the previous embodiment illustrated in FIG. 2.

A Schottky contact area 355 including a Schottky contact made of a material of the conductive plugs 347 and the n-type well region 351 is included in a cell array of the n-type trench FET 320. By electrically coupling the source of the high-side n-type lateral DMOS 310 and the drain of the low-side trench 320, a half-bridge configuration can be achieved. This half-bridge configuration including the Schottky contact area 355 may be used in a DC/DC converter, for example.

FIG. 4 illustrates a schematic cross-sectional view of a portion of a semiconductor device 400 including one semiconductor die 401, the one semiconductor die 401 including a p-type trench FET 410 and an n-type trench FET 420 in half-bridge configuration. The one semiconductor die 401 includes a semiconductor substrate 440 of p$^+$-type in a region of the p-type trench FET 410 and of n$^+$-type in a region of the n-type trench FET 420. For example, a thickness of the semiconductor substrate 440 may be several tens of micrometers, e.g., 40 μm and the semiconductor substrate 440 may be selectively doped, e.g., by diffusion prior to the formation of a p-type epitaxial layer 441 on the semiconductor substrate 440. A drain of the p-type trench FET 410 and the drain of the n-type trench FET 420 are electrically coupled via at least one conductive layer such as a metal layer or metal layer stack formed at a first side 402 of the one semiconductor die 401.

Similar to the n-type trench FET 320 described above with reference to FIG. 3, the n-type trench FET 420 includes an n-type well region constituting a drain of FET 420, a p-type body region 452, trenches 453 having gate regions 448b formed therein, an insulation structure 449 which is also partly formed within the trenches 453, n⁺-type source regions 445 electrically coupled to a contact area 437 at a second side 403 of the one semiconductor die 401 opposite to the first side 402 via conductive plugs 447. The p-type body region 452 is electrically coupled to the contact area 437 via a p⁺-type region 450b and the conductive plugs 447.

The p-type trench FET 410 includes an n-type body region 460 formed within the p-type epitaxial layer 441, trenches 453 having gate regions 448a and part of the insulating structure 449 arranged therein, p⁺-type source regions 450a electrically coupled to a contact area 435 at the first side 403 of the one semiconductor die 401 via the conductive plugs 447. The n-type body region 460 is electrically coupled to the contact region 435 via the n⁺-type regions 445 and the conductive plugs 447.

The gate regions 448a, 448b may be electrically coupled to contact areas at the second side 403 as described above with reference to the embodiment illustrated in FIG. 2.

FIG. 5 refers to a schematic cross-sectional view of a portion of a semiconductor device 500 including one semiconductor die 501, the one semiconductor die 501 including a first n-type trench FET 510 as a high-side switch and a second n-type trench FET 520 as a low-side switch in half-bridge configuration.

The one semiconductor die 501 includes an n⁺-type substrate 540 having a first n-type epitaxial layer 541a formed on the n⁺-type semiconductor substrate 540, a second p-type epitaxial layer 541b formed on the first n-type epitaxial layer 541a and a third n-type epitaxial layer 541c formed on the second p-type epitaxial layer 541b. The second p-type epitaxial layer 541b constitutes a body region of both the first trench FET 510 and the second trench FET 520.

Trenches 553 extend from a first side 542 of the third n-type epitaxial layer 541c into the first n-type epitaxial layer 541a. Within the trenches 553 of the first trench FET 510, gate electrode regions 548a and part of an insulation structure 549 are formed, whereas in the trenches 553 of the second trench FET 520, gate electrode regions 548b and another part of the insulation structure 549 are formed.

The first trench FET 510 furthermore includes first conductive plugs 546 electrically coupling the second p-type epitaxial layer 541b to the n⁺-type substrate 540, n⁺-type source regions 565 formed within the first n-type epitaxial layer 541a, n⁺-type drain regions 566 formed within the third n-type epitaxial layer 541c as well as a contact area 535 electrically coupled to the n⁺-type drain regions 566.

The second trench MOSFET 520 furthermore includes conductive spacers 567 such as n⁺-type polysilicon spacers as source regions electrically coupled to a contact area 537 at a second side 503 of the one semiconductor side 501. Second conductive plugs 547 and p⁺-type regions 550b provide an electrical connection between the contact area 537 and the second p-type epitaxial layer 541b constituting a body region of the second trench FET 520.

FIG. 6 illustrates a schematic cross-sectional view of a portion of a semiconductor device 600 including one semiconductor die 601, the one semiconductor die 601 including a half-bridge configuration of a first n-type trench FET 610 as a high-side switch and a second n-type trench FET 620 as a low-side switch.

Similar to the embodiment illustrated in FIG. 5, the one semiconductor die 601 includes an n⁺-type semiconductor substrate 640, a first n-type epitaxial layer 641a formed on the n⁺-type semiconductor substrate 640, a second p-type epitaxial layer 641b formed on the first n-type epitaxial layer 641a, whereas distinct from the embodiment illustrated in FIG. 5, a third p-type epitaxial layer 641c is formed on the second p-type epitaxial layer 641b.

In addition to n⁺-type regions 666 formed within the third p-type epitaxial layer 641c, the first trench FET 610 includes n-type zones 670 laterally adjacent to trenches 653 and opposing each other between neighbouring trenches 653, the trenches 653 extending from a first side 642 of the third p-type epitaxial layer 641c into the first n-type epitaxial layer 641a. The n-type zones 670 and the n⁺-type regions 666 constitute a drain of FET 610. Within the trenches 653, gate regions 648a and part of an insulating structure 649 is formed. The first trench FET 610 furthermore includes n⁺-type source regions 665 formed within the first n-type epitaxial layer 641a. First conductive plugs 646 electrically couple the second p-type epitaxial layer 641b to the n⁺-type semiconductor substrate 640. Second conductive plugs 647 provide an electrical connection of the n⁺-type drain regions 666 to a contact area 635 at a second side 603 of the one semiconductor die 601.

The second trench FET 620 includes trenches 653 extending from the first side 642 of the third p-type epitaxial layer 641c into the first n-type epitaxial layer 641a. Within the trenches gate regions 648b and part of the insulating structure 649 is formed. N⁺-type source regions 672 are formed within the third p-type epitaxial layer 641c, whereas n-type zones 671 laterally adjacent to sidewalls of the trenches 653 are formed between the n⁺-type source regions 672 and the second p-type epitaxial layer 641b opposing each other between neighbouring two of the trenches 653. The n⁺-type source regions 672 are electrically coupled to a contact area 637 at a second side 603 of the one semiconductor die 601 via the second conductive plugs 647. The second conductive plugs 647 and p⁺-type regions 650b within the third p-type epitaxial layer 641c provide an electrical connection between the contact area 637 and the second p-type epitaxial layer 641b constituting a body region of the second trench FET 620.

Figure 7:
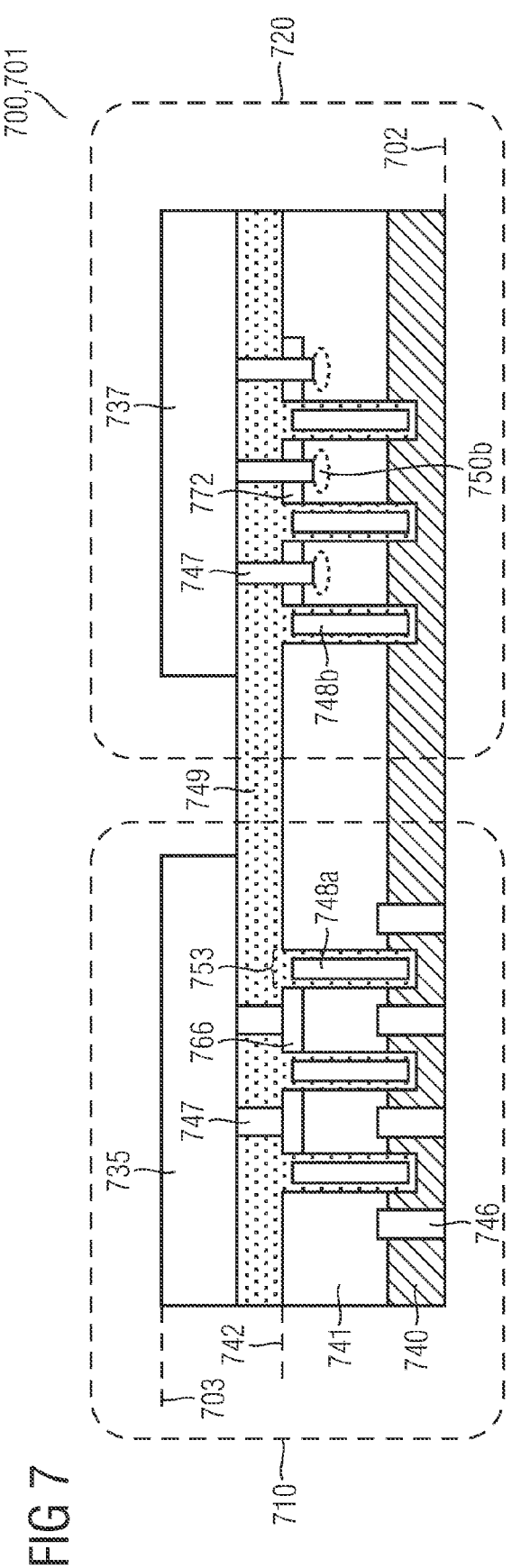
FIG. 7 is a schematic cross-sectional view of a portion of a semiconductor device including an n-type trench MOSFET high-side switch and an n-type trench MOSFET low-side switch for low voltage applications according to one embodiment.

FIG. 7 illustrates a schematic cross-sectional view of a portion of a semiconductor device 700 including one semiconductor die 701, the one semiconductor die 701 including a half-bridge configuration of a first n-type trench FET 710 and a second n-type trench FET 720.

The one semiconductor die includes an n⁺-type substrate 740 having a p-type epitaxial layer 741 formed thereon. Trenches 753 including gate electrodes 748a, 748b and part of an insulating structure 749 therein extend from a first side 742 of the p-type epitaxial layer 741 into the n⁺-type substrate 740. The p-type epitaxial layer 741 constitutes a body region of both the first trench FET 710 and the second trench FET 720. The n⁺-type semiconductor substrate 740 constitutes a source of the first trench FET 710 and a drain of the second trench FET 720. N⁺-type regions 766 formed in the p-type epitaxial layer 741 constitute drain regions of the first trench FET 710, the drain regions 766 being electrically coupled to a contact area 735 at a second side 703 of the one semiconductor die 701 opposite to a first side 702 via second conductive plugs 747. First conductive plugs 746 electrically couple the p-type epitaxial layer 741 constituting a body region of the first trench FET 710 to the n⁺-type semiconductor substrate 740.

N⁺-type regions 772 formed in the p-type epitaxial layer 741 of the second trench FET 720 constitute source regions electrically coupled to a contact area 737 at the second side 703 of the one semiconductor die 701 via the second conductive plugs 747. The p-type epitaxial layer 741 constituting the body region of the second trench FET 720 is electrically coupled to the contact area 737 via p⁺-type regions 750b and the conductive plugs 747. Semiconductor devices 700 may be used for low-voltage applications, for example.

Figure 8A:
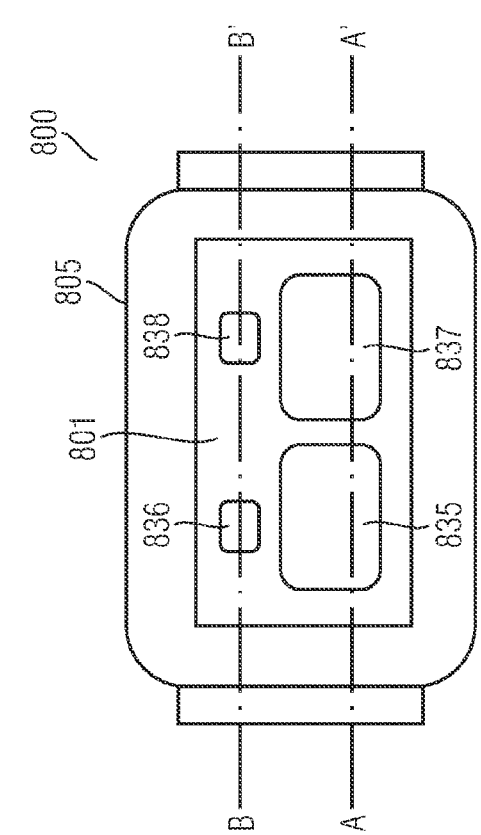
FIG. 8A illustrates a schematic plan view of a semiconductor device including one semiconductor die having a first FET and a second FET housed in a CanPAK package.

FIG. 8A illustrates a schematic plan view of a semiconductor device 800 including a half-bridge configuration in one semiconductor die 801 having a high-side FET and a low-side FET housed in a CanPAK package 805. The one semiconductor die 801 has one of source/drain of the high-side FET and one of source/drain of the low-side FET electrically coupled via a first side of the one semiconductor die 801 (not illustrated in FIG. 8A). The other one of source/drain of the high-side FET is electrically coupled to a contact area 835 at a second side of the one semiconductor die 801 opposite to the first side, the other one of source/drain of the low-side of FET is electrically coupled to a contact area 837 at the second side, a gate of the high-side FET is electrically coupled to a contact area 836 at the second side and the gate of the low-side FET is electrically coupled to a contact area 838 at the second side. The contact areas 835, 836, 837 and 838 are electrically separated from each other, respectively.

FIG. 8B illustrates a schematic cross-sectional view along a cut line AA' of the semiconductor device 800 illustrated in FIG. 8A. The one of source/drain of the high-side FET is electrically coupled to the one of source/drain of the low-side FET via a contact area 830 at the first side 802 of the one semiconductor die opposite to the second side 803. Although contact areas are formed on both sides of the one semiconductor die 801, all electrical connectors of the CanPAK package such as connectors 839a, 839b, 839c, 839d are provided at a bottom side.

FIG. 8C illustrates a schematic cross-sectional view along a cut line BB' of the semiconductor device 800 illustrated in FIG. 8A. Similar to the contact areas 835 and 837 illustrated in FIG. 8B, the contact areas 836, 838 electrically coupled to the gates of the high-side FET and the low-side FET are accessible via the connectors 839d and 839e provided at a bottom side of the CanPAK package 805.

In the simplified plan view of a printed circuit board (PCB) 809 illustrated in FIG. 8D, the semiconductor device 800 is mounted on the PCB 809 having an input capacitance 825 soldered on the PCB 809. The input capacitance 825 is electrically coupled between the contact areas 835 and 837 of the semiconductor device 800. The input capacitance 825 may be located close to the connectors 839b and 839c of the semiconductor device 800 to reduce parasitic inductance.

Figure 9:
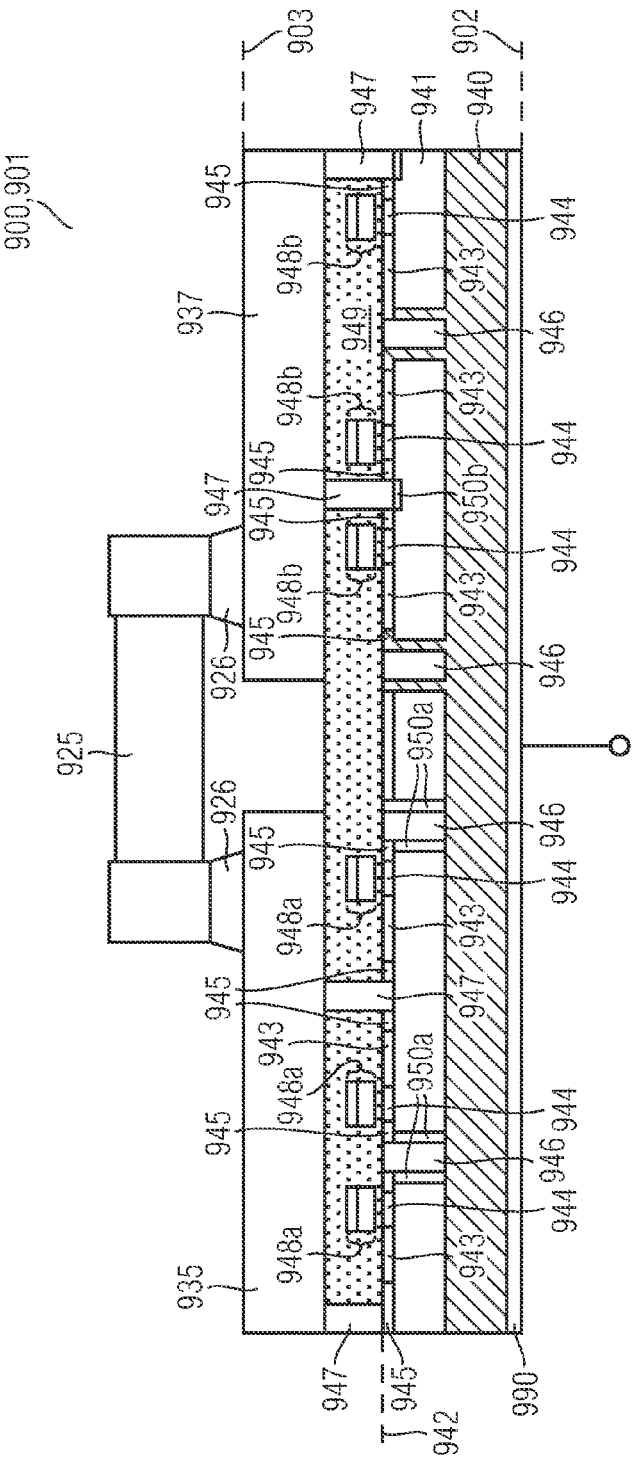
FIG. 9 illustrates a schematic cross-sectional view of the portion of the semiconductor device illustrated in FIG. 2 having an input capacitance mounted thereon.

FIG. 9 illustrates a schematic cross-sectional view of the semiconductor device 200 illustrated in FIG. 2 and an input capacitance 925 electrically coupled between the contact areas 205 and 207, i.e. between a drain of high-side FET 210 and a source of low-side FET 220, via solder 926.

Placing the input capacitance 925 on the half-bridge configuration of the one semiconductor die 201, parasitic inductance may be reduced and thus voltage overshoots at a phase node of the half-bridge configuration, i.e. at the drain of the low-side FET, may be reduced. Hence, the efficiency of synchronous rectification may be increased.

Figure 10A:
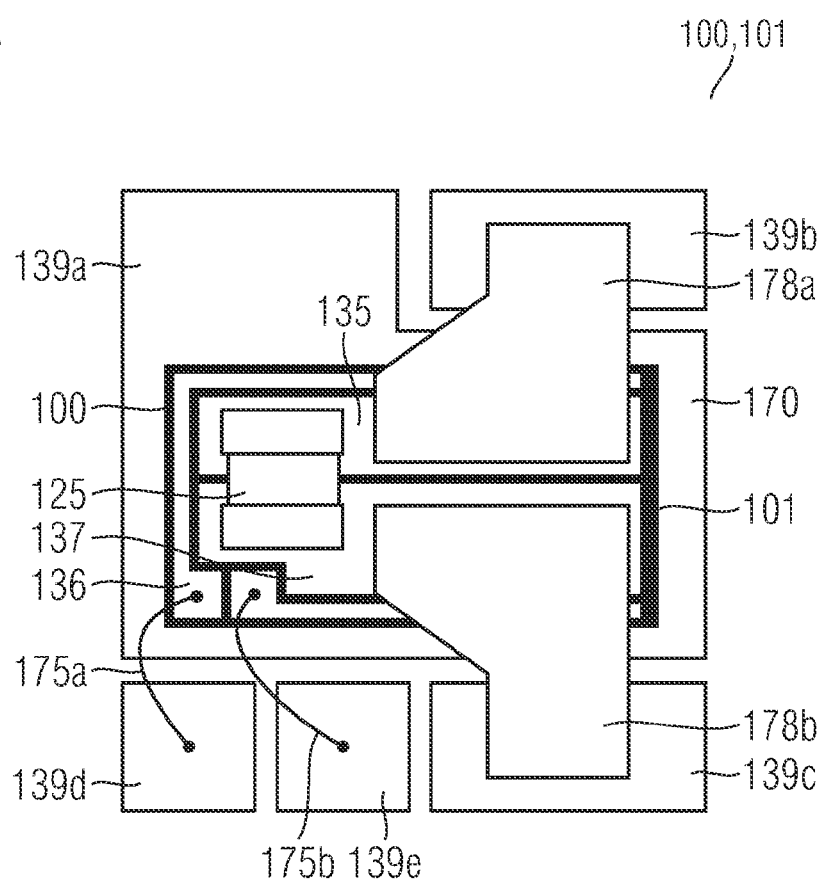
FIG. 10A illustrates a schematic plan view of a semiconductor device including one semiconductor die mounted on a lead frame, an input capacitance mounted on the one semiconductor die and conductive clips interconnecting the one semiconductor die and external pins according to one embodiment.

FIG. 10A illustrates a schematic plan view of a semiconductor device 100 including the one semiconductor die 101 illustrated in FIG. 1 which is mounted on a lead frame 170 via the first side 102. An input capacitance 125 is mounted on and electrically coupled to contact areas 135 and 137 of the one semiconductor die 101, e.g., by solder. Bond wires 175a, 175b electrically couple the contact areas 136, 138 of the high-side FET, the low-side FET of the one semiconductor die 101 to connectors 139d, 139e. Conductive clips 178a, 178b electrically couple the contact areas 135, 137 to respective connectors 139b and 139c. The lead frame 170 corresponds to a phase node of the half-bridge configuration and is accessible via connector 139a. The connectors 139a, 139b, 139c, 139d, 139e may correspond to an output pin such as $V_{out}$, an input pin such as a supply pin $V_{in}$, a ground pin, a gate pin for the high-side switch and a gate pin for the low-side switch, respectively.

Figure 10B:
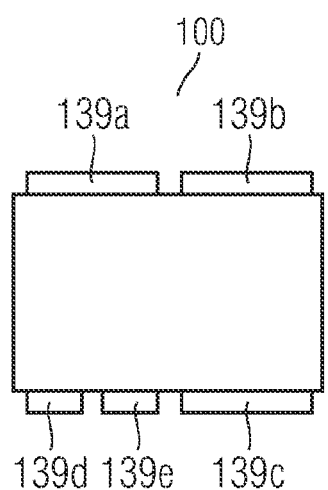
FIG. 10B illustrates a schematic plan view of the semiconductor device of FIG. 10A in a moulded state.

In the schematic plan view illustrated in FIG. 10B, the semiconductor device 100 is illustrated after moulding.

Figure 11:
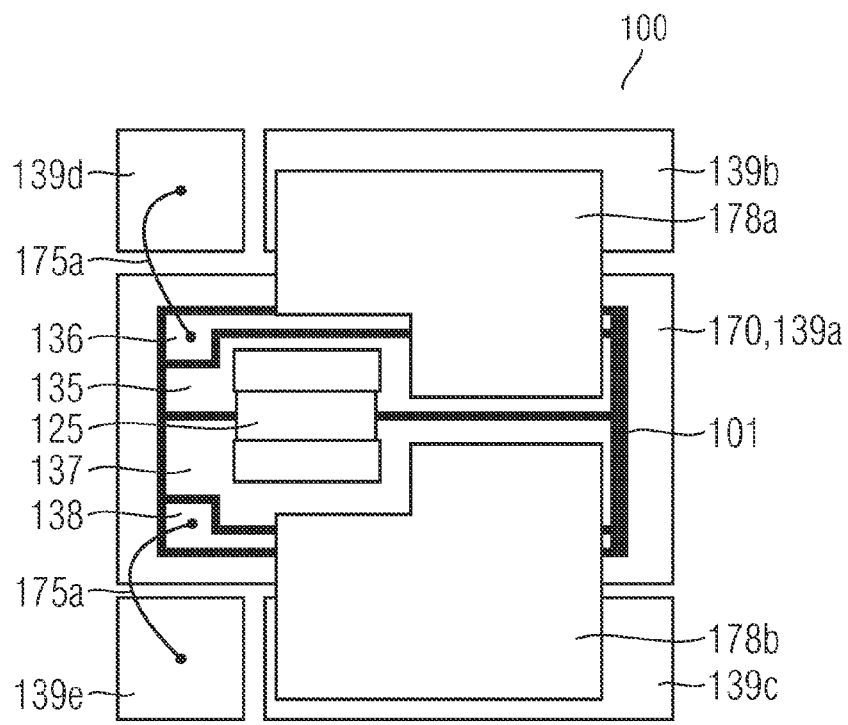
FIG. 11 illustrates a schematic plan view of a semiconductor device including one semiconductor die mounted on a lead frame, an input capacitance mounted on the one semiconductor die and conductive clips interconnecting the one semiconductor die and the external pins, the lead frame being exposed to an outside of a package.

FIG. 11 illustrates a schematic plan view of a semiconductor device 100 according to another embodiment. The embodiment illustrated in FIG. 11 differs from the embodiment illustrated in FIG. 10A with regard to arrangement of the conductive clips 178a, 178b and the connectors 139a . . . 139e. In the embodiment illustrated in FIG. 11, the lead frame 170 is exposed to an outside of a package of the semiconductor device 100. Therefore, the lead frame 170 equals the connector 139a.

Figure 12:
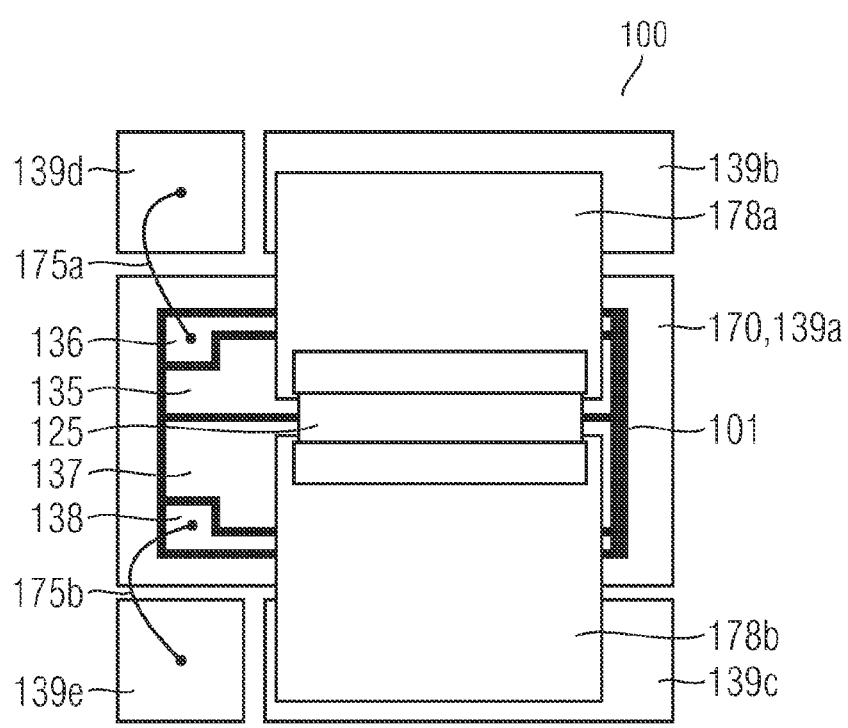
FIG. 12 illustrates a schematic plan view of a semiconductor device including one semiconductor die mounted on a lead frame, conductive clips interconnecting the one semiconductor die and external pins, and an input capacitance mounted on the conductive clips, the lead frame being exposed to an outside of a package.

FIG. 12 illustrates a schematic plan view of a semiconductor device 100 according to another embodiment. The embodiment illustrated in FIG. 12 differs from the embodiment illustrated in FIG. 11 with regard to arrangement of the conductive clips 178a, 178b and input capacitance 125. In the embodiment illustrated in FIG. 12, the input capacitance 125 is electrically coupled to contact areas 135 and 137 of the one semiconductor die 101 via the conductive clips 178a, 178b.

Figure 13:
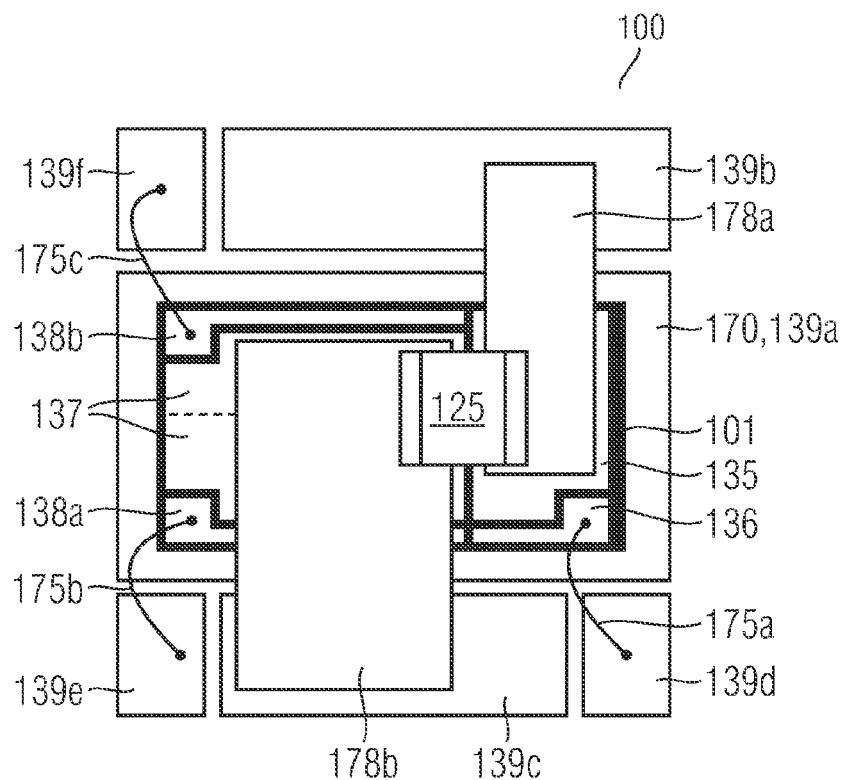
FIG. 13 illustrates a schematic plan view of a semiconductor device including one semiconductor die mounted on a lead frame, conductive clips interconnecting the one semiconductor die and external pins, an input capacitance mounted on the conductive clips and two gate pins assigned to different loads on a low-side switch of the one semiconductor die, the lead frame being exposed to an outside of a package.

FIG. 13 illustrates a schematic plan view of a semiconductor device 100 according to another embodiment. The embodiment illustrated in FIG. 13 differs from the embodiment illustrated in FIG. 12 with regard to arrangement of the conductive clips 178a, 178b and the connectors 139a . . . 139e. The embodiment illustrated in FIG. 13 furthermore includes connector 139f electrically coupled to a first gate contact area 138a of the low-side FET and connector 139e is electrically coupled to a second gate contact area 138b of the low-side FET. Via the contact areas 138a, 138b different portions of the low-side switch may be driven allowing for an improved efficiency of the low-side switch with regard to load and frequency.

Figure 14:
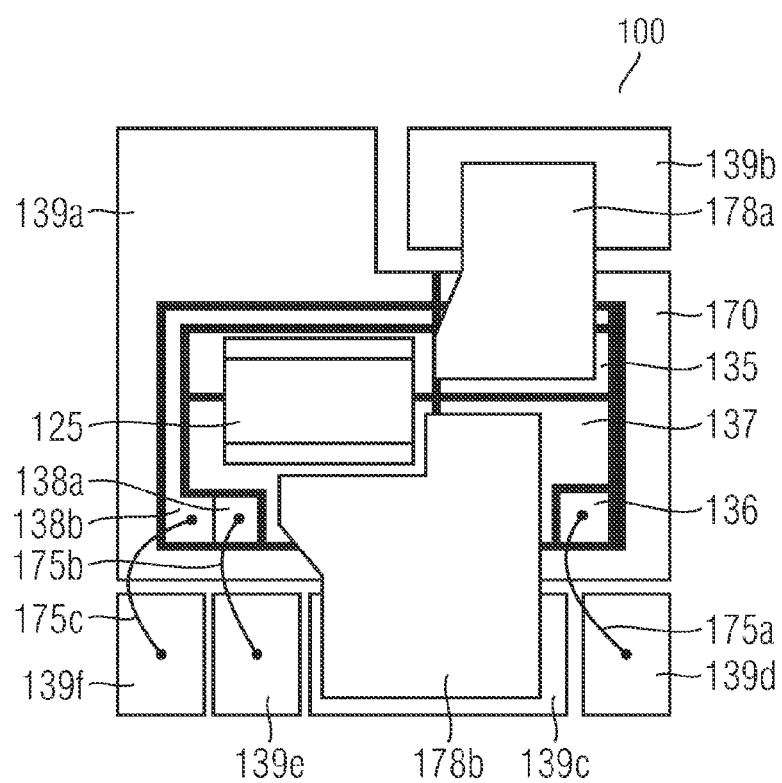
FIG. 14 illustrates a schematic plan view of a semiconductor device including one semiconductor die mounted on a lead frame, conductive clips interconnecting the one semiconductor die and external pins, an input capacitance mounted on the one semiconductor die and two gate pins assigned to different loads on a low-side switch of the one semiconductor die.

FIG. 14 illustrates a schematic plan view of a semiconductor device 100 according to another embodiment. The embodiment illustrated in FIG. 14 differs from the embodiment illustrated in FIG. 13 with regard to arrangement of the conductive clips 178a, 178b, connectors 139a . . . 139f and input capacitance 125. In the embodiment illustrated in FIG. 14, the input capacitance 125 is electrically coupled to and mounted on contact areas 135 and 137 of the one semiconductor die 101.

Figure 15:
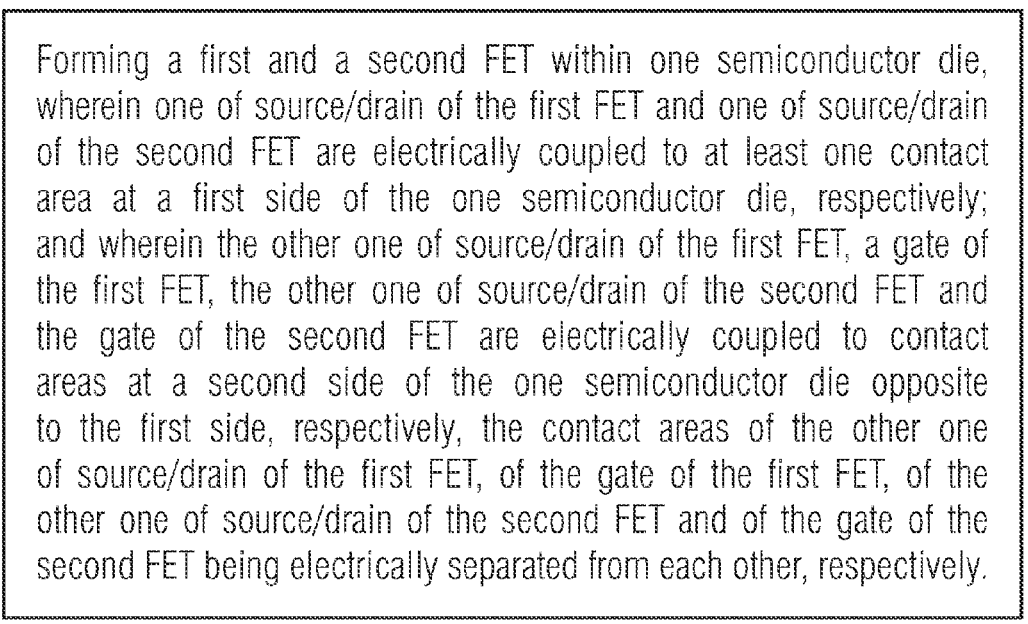
FIG. 15 is a simplified flow chart illustrating a method of manufacturing a semiconductor device according to one embodiment.

FIG. 15 illustrates a simplified flow chart of a method of manufacturing a semiconductor device in accordance with a further embodiment. In S100 a first and a second FET are formed within one semiconductor die, wherein one of source/drain of the first FET and one of source/drain of the second FET are electrically coupled to at least one contact area at the first side of the one semiconductor die, respectively, and wherein the other one of source/drain of the first FET, a gate of the first FET, the other one of source/drain of the second FET and the gate of the second FET are electrically coupled to contact areas at a second side of the one semiconductor die opposite to the first side, respectively, the contact areas of the other one of source/drain of the first FET, of the gate of the first FET, of the other one of source/drain of the second FET and of the gate of the second FET being electrically separated from each other, respectively.

According to one embodiment, the formation of the first and the second FET includes forming a first n-type epitaxial layer on an n-type semiconductor substrate, forming a conductive plug through the first n-type epitaxial layer to the n-type semiconductor substrate in an area of the first FET, forming a p-type epitaxial layer on the n-type epitaxial layer, the p-type epitaxial layer being electrically coupled to the n-type semiconductor substrate via the conductive plug, forming trenches through the p-type epitaxial layer and into the first n-type epitaxial layer in a region of both the first FET and the second FET, and forming a gate dielectric and a gate electrode within the trenches, the p-type epitaxial layer constituting a body region of both the first FET and the second FET.

The formation of the first and the second FET may also include forming a second n-type epitaxial layer on the p-type epitaxial layer. The formation of the first and the second FET may further include introducing n-type dopants into the p-type epitaxial layer via a sidewall of the trenches.

According to another embodiment, the formation of the first and the second FET includes forming a p-type epitaxial layer on an n-type semiconductor substrate, forming trenches through the p-type epitaxial layer and into the n-type semiconductor substrate in a region of both the first FET and the second FET, forming a gate dielectric and a gate electrode within the trenches, the p-type epitaxial layer constituting a body region of both the first FET and the second FET.

The formation of the first and the second FET may further include forming the first and the second FET as an n-type channel lateral FET, respectively, including forming a p-type epitaxial layer on an n-type semiconductor substrate, and forming an electrical connection from the at least one contact area at the first side to the ones of source/drain of the first and second transistors by conductive plugs extending through the p-type epitaxial layer.

The formation of the first and the second FET may also include forming the first FET as an n-type channel lateral FET and the second FET as an n-type channel trench FET, respectively, including forming a p-type epitaxial layer on an n-type semiconductor substrate, and forming an electrical connection from the contact area of the first FET at the first side to the one of source/drain of the first FET by a conductive plug extending through the p-type epitaxial layer. A Schottky contact area connected in parallel to the one and the other one of source/drain of the second FET may be formed.

According to another embodiment of a method for manufacturing a semiconductor device, the method includes forming a first n-type channel lateral FET and a second n-type channel trench FET within one semiconductor die, wherein one of source/drain of the first FET and one of source/drain of the second FET are electrically coupled to at least one contact area at a first side of the one semiconductor die, respectively; and wherein the other one of source/drain of the first FET, a gate of the first FET, the other one of source/drain of the second FET and the gate of the second FET are electrically coupled to contact areas at a second side of the one semiconductor die opposite to the first side, respectively, the contact areas of the other one of source/drain of the first FET, of the gate of the first FET, of the other one of source/drain of the second FET and of the gate of the second FET being electrically separated from each other, respectively, mounting the one semiconductor die via the first side on a single lead frame, and housing the one semiconductor die mounted on the single lead frame in a package. FIGS. 16A-16K refer to a method of manufacturing a semiconductor device including a half-bridge configuration in a first and a second trench FET in one semiconductor die such as the one semiconductor die 501 illustrated in FIG. 5.

Figure 16A:
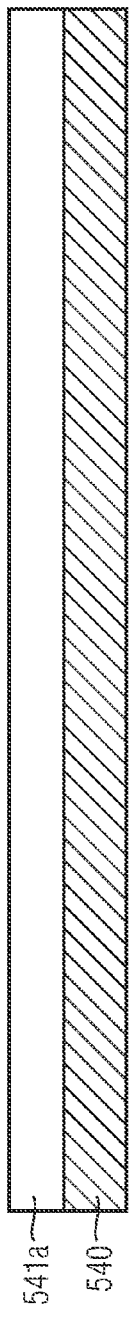
FIGS. 16A to 16K illustrate schematic cross-sectional views of one semiconductor die for illustrating a method of manufacturing a semiconductor device including a first trench FET and a second trench FET in half-bridge configuration in accordance with one embodiment.

According to FIG. 16A, a first n-type epitaxial layer 541a is formed on an n$^+$-type semiconductor substrate 540.

Figure 16B:
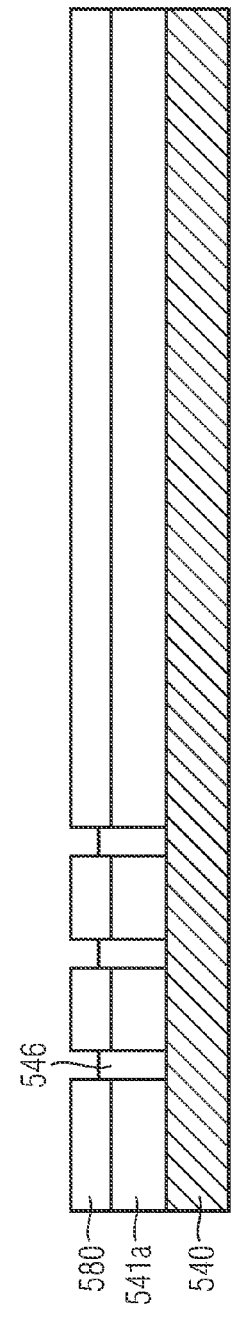

As illustrated in FIG. 16B, first conductive plugs 546 are formed through the first n-type epitaxial layer 541a extending to the n$^+$-type semiconductor substrate 540 using a first mask 580. The first mask may be a lithographically patterned mask.

Figure 16C:
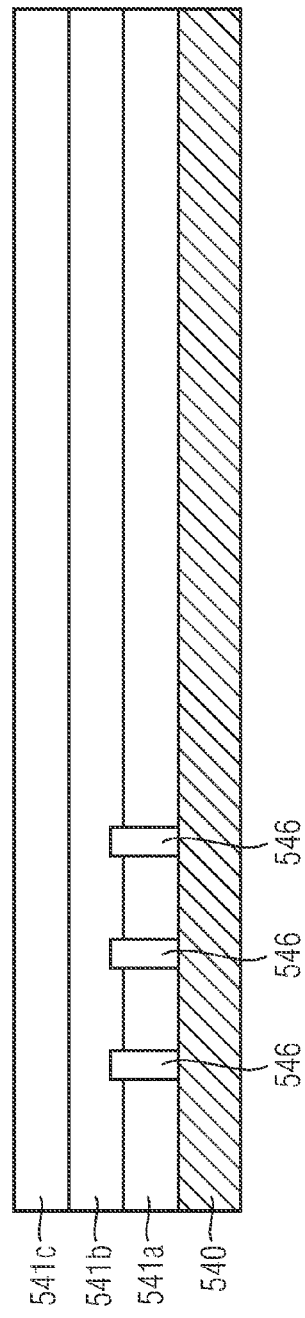

Referring to FIG. 16C, a second p-type epitaxial layer 541b is formed on the first n-type epitaxial layer 541a. A third n-type epitaxial layer 541c is formed on the second p-type epitaxial layer 541b.

Figure 16D:
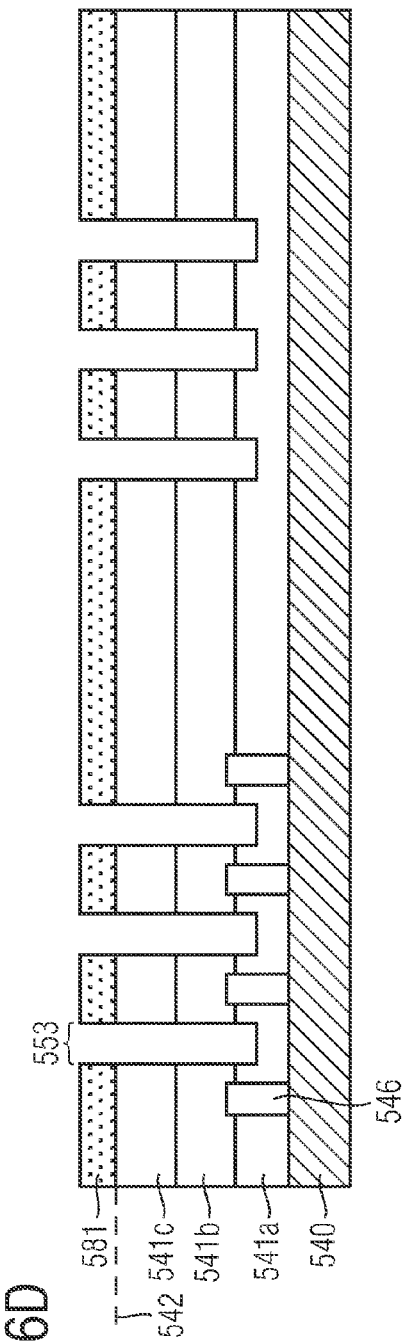

As illustrated in FIG. 16D, trenches 553 are formed from a first side 542 of the third n-type epitaxial layer 541c extending into the first n-type epitaxial layer 541a using a second mask 581. The trenches 553 may be formed by etching, for example.

Figure 16E:
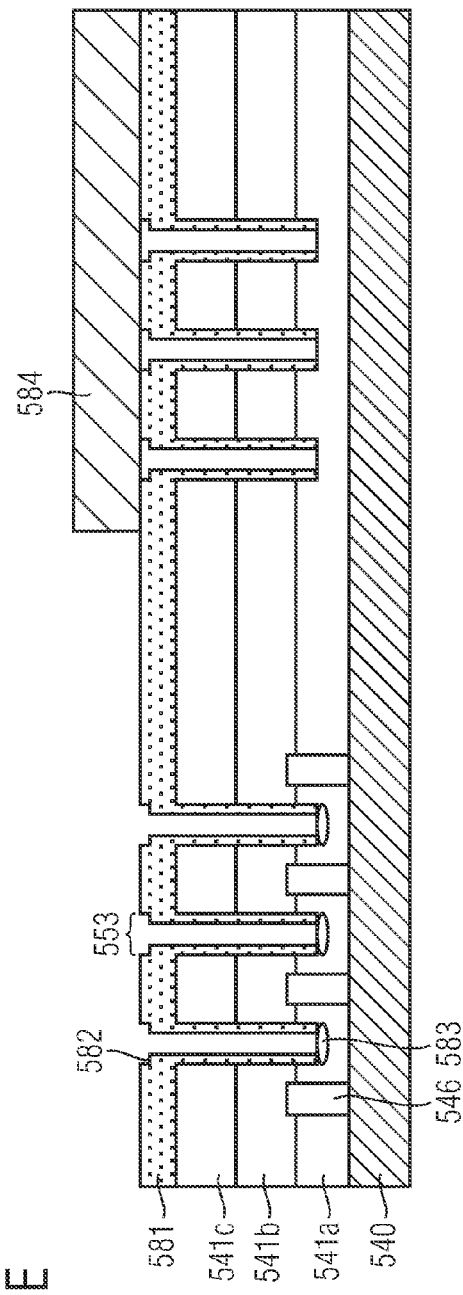

As illustrated in FIG. 16E, spacers 582 are formed at sidewalls of the trenches 553 and n-type dopants such as P or As are implanted into the first n-type epitaxial layer 541a in a region of a to be formed high-side switch. The n-type dopants 583 are kept away from the region of a to be formed low-side switch by a third mask 584.

Figure 16F:
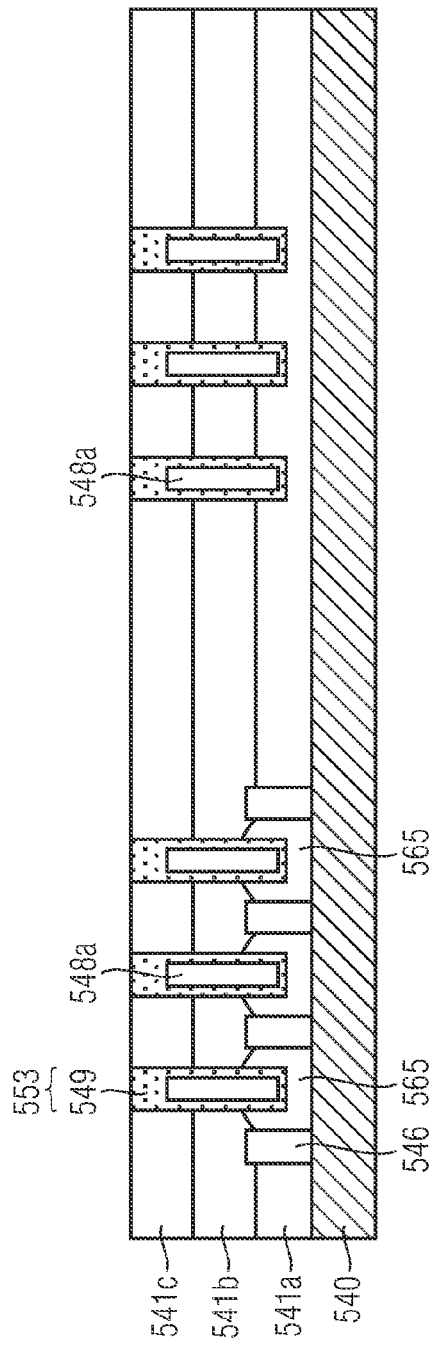

As illustrated in FIG. 16F, after removing the masks 581, 584 and the spacers 582, gate electrode regions 548a, 548b and an insulating structure 549 are formed within the trenches 553. As an example, a gate oxide layer as part of the insulating structure 549 may be formed followed by deposition of polysilicon. After etching back the polysilicon to form gate electrodes 548a, 548b, the trenches 553 may be filled with oxide constituting a further part of the insulating structure 549. During formation of the insulating structure 549, the n-type dopants 583 may diffuse forming n$^+$-type source regions 565 in a region of the to be formed high-side switch.

Figure 16G:
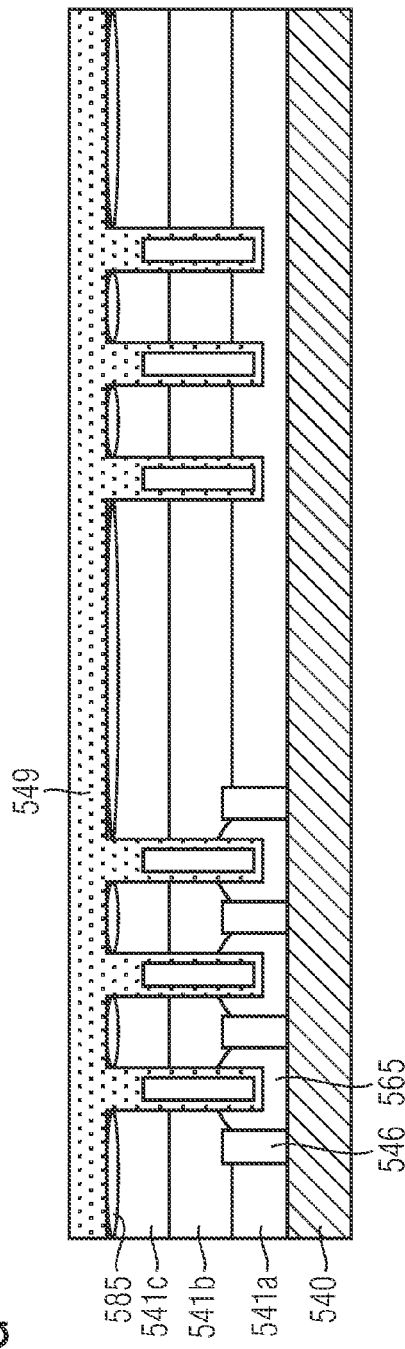

Referring to FIG. 16G, n-type dopants 585 are implanted into the third n-type epitaxial layer 541c. An insulating layer is formed on the third n-type epitaxial layer 541c constituting part of the insulating structure 549. Hence, the insulating structure 549 may include a plurality of dielectric materials such as silicon oxide, e.g., thermally grown silicon oxide, boro-phosphor-silicate glass (BPSG), phosphor-silicate glass (PSG) and silicon nitride.

Figure 16H:
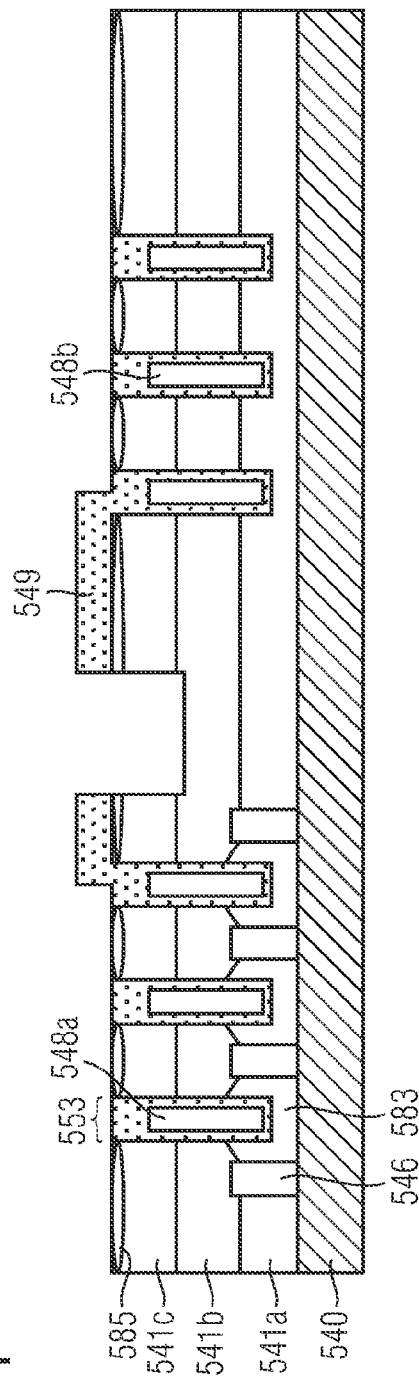

As illustrated in FIG. 16H, part of the insulating structure 549 is patterned, e.g., by selective etching using lithography. The third n-type epitaxial layer 541c is removed in a region of the to be formed low-side switch by patterning. Patterning of the third n-type epitaxial layer 541c may be carried out by a mesa etch, for example.

Figure 16I:
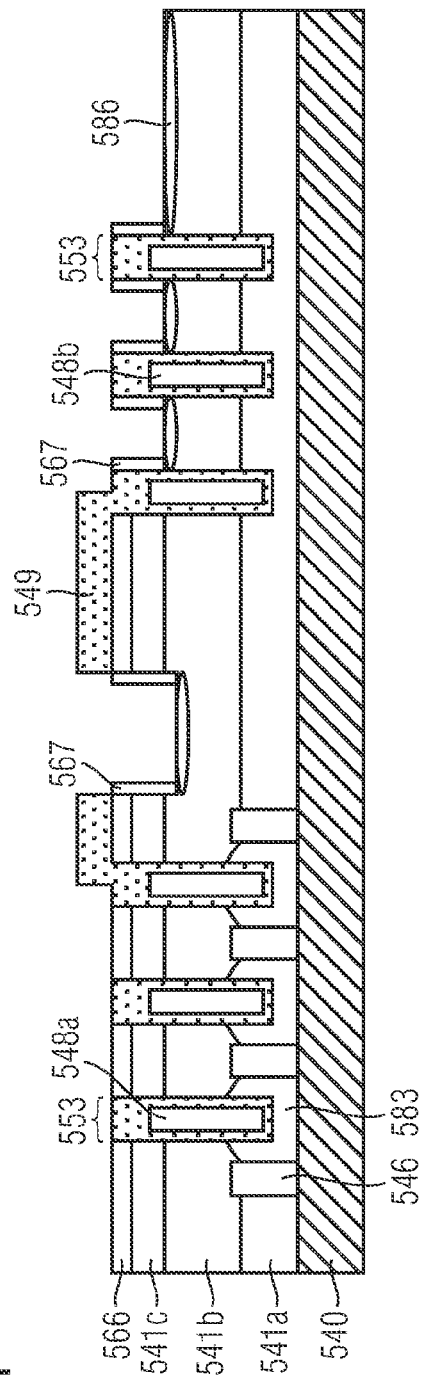

As illustrated in FIG. 16I, dopants 585 are diffused forming n$^+$-type drain regions 566 in a region of the to be formed high-side switch. Diffusion of the dopants 585 may be achieved by thermal treatment. Furthermore, conductive spacers 567 such as n$^+$-type polysilicon spacers are formed at sidewalls of the trenches 553 in a region of the to be formed low-side switch. P-type dopants are implanted into the second p-type epitaxial layer 541b and by appropriately selecting a dose of the p-type dopants 586, these dopants may also be implanted into the third n-type epitaxial layer 541c so that the formation of a further mask on the third n-type epitaxial layer 541c may be omitted. The dose of the p-type dopants 586 may be chosen such that these dopants do not compensate the n-type dopants of the n$^+$-type drain regions 566.

Figure 16J:
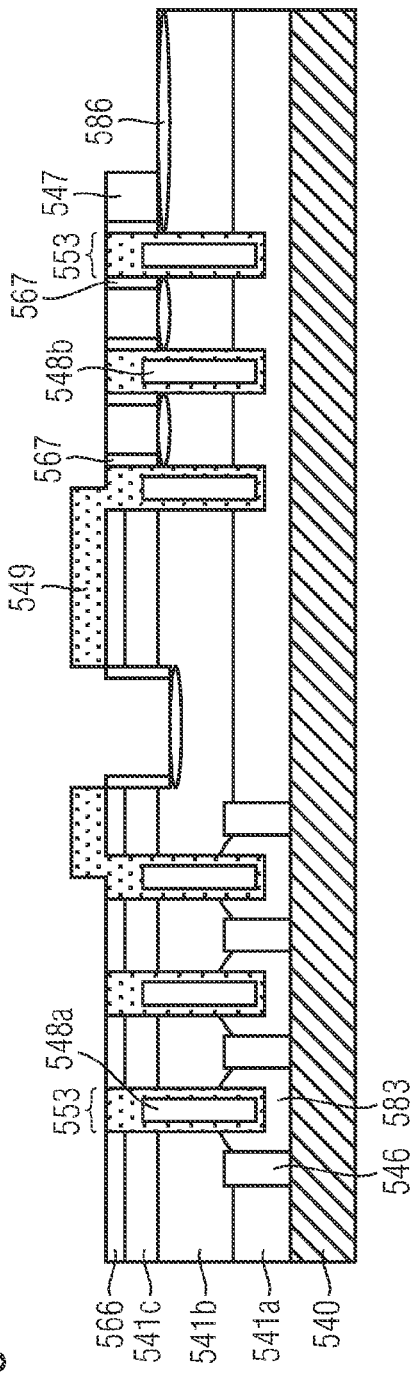
Figure 16K:
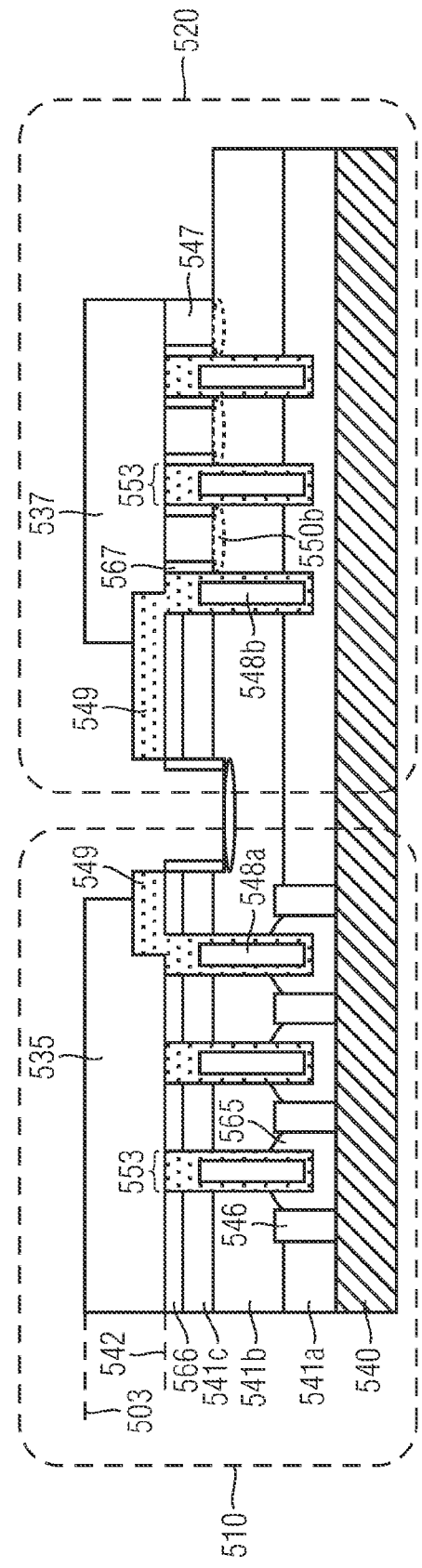

Referring to FIG. 16J, second conductive plugs 547, e.g., carbon (C) plugs, are formed between opposing two of the conductive spacers 567, e.g., by layer deposition and recess. A contact to the gate electrodes (not illustrated in FIG. 16G) may be provided at widened ends of the trenches 553 by contact holes. These widened ends may be part of the trenches 553 along a direction perpendicular to the drawing plane of FIG. 16J. As illustrated in FIG. 16K, contact areas 535, 537, e.g., metal layer(s) such as AlSiCu or TiW/Cu are formed by deposition and lithographic patterning, the contact areas 535, 537 being electrically coupled to n$^+$-type drain regions 566 of high-side FET 510, conductive spacers 567 as source regions of low-side FET 520. Thus, the one semiconductor die 501 includes monolithically integrated high-side FET 510 and low-side FET 520 in half-bridge configuration.

Figure 17:
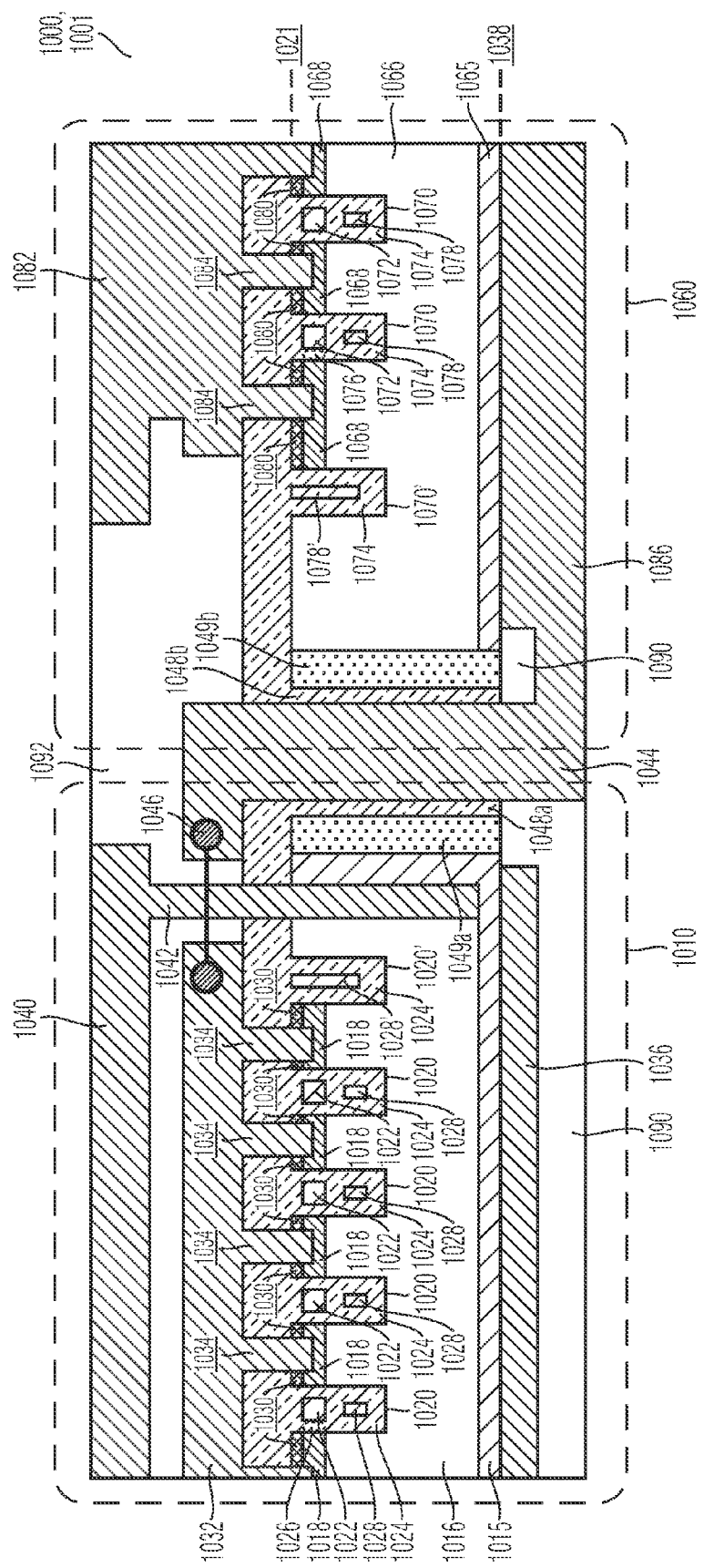
FIG. 17 illustrates a schematic cross-section of a portion of one embodiment of a semiconductor device including an n-type channel vertical FET high-side switch and an n-type channel vertical FET low-side switch and a contact electrically coupling a source of the high-side switch at a first side to a drain of the low-side switch at a second side opposite to the first side, wherein the contact is arranged between the high-side switch and the low-side switch.

FIG. 17 refers to a schematic cross-sectional view of a portion of one embodiment of a semiconductor device 1000 including one semiconductor die 1001, the one semiconductor die 1001 including a half-bridge configuration including a first n-type channel vertical FET 1010 as a high-side switch and a second n-type channel vertical FET 1060 as a low-side switch.

The first n-type channel vertical FET 1010 includes an optional first n$^+$-type semiconductor layer 1015, e.g. an n$^+$-type silicon layer, and a first n-type epitaxial layer 1016 formed on the optional first n$^+$-type semiconductor layer 1015. The optional first n$^+$-type semiconductor layer 1015 may be a reminder of an n$^+$-type semiconductor substrate that has previously been partially removed by an appropriate process such as etching or grinding.

The first n-type channel vertical FET 1010 further includes p-type body regions 1018 arranged between trenches 1020 extending from a second side 1021 of the one semiconductor die 1001 into the first n-type epitaxial layer 1016. Within each one of the trenches 1020, a gate electrode 1022 is arranged and electrically insulated from surrounding conductive elements via an insulating structure 1024. The insulating structure 1024 may include one or a plurality of insulating parts such as a gate insulator 1026 arranged between the gate electrode 1022 and the body region 1018. A conductivity of a channel region adjoining to the gate insulator 1026 may be controlled by a voltage applied to the gate electrode 1022. Apart from the gate electrodes 1022, each of the trenches 1020 includes one field electrode 1028 below the gate electrode 1022. The field electrode 1028 is also surrounded by the insulating structure 1024. In the embodiment illustrated in FIG. 17, each trench 1020 includes one field electrode 1028. Other embodiments lack any field electrode within the trenches 1020 or may even include more than one field electrode, e.g. two, three, four or even more field electrodes. In the embodiment illustrated in FIG. 17, a termination trench 1020' is arranged in a peripheral area of the first n-type channel vertical FET 1010. The termination trench 1020' includes a termination field electrode 1028' surrounded by the insulating structure 1024. In the embodiment of FIG. 17, one termination trench 1020' and one termination field electrode 1028' are illustrated. According to other embodiments a different number of termination trenches including 0, and/or termination field electrodes per termination trench may be used. The termination trench 1020' and the termination field electrode 1028' may improve the voltage blocking capability in the peripheral region of the first n-type channel vertical FET 1010.

The first n-type channel vertical FET 1010 further includes n$^+$-type source regions 1030 at the second side 1021. The n$^+$-type source regions 1030 and the p-type body regions 1018 are electrically coupled to a high-side source rewiring area 1032 at the second side 1021 via active area contacts 1034 such as conductive plugs or conductive lines. The first n-type epitaxial layer 1016 constitutes a drift zone of the first n-type channel vertical FET 1010. The optional first n$^+$-type semiconductor layer 1015 functions as a drain of the first n-type channel vertical FET 1010. A sheet conductivity of the drain may be decreased by a metal layer 1036 adjoining to the optional first n$^+$-type semiconductor layer at a first side 1038 of the one semiconductor die 1001. The first n$^+$-type semiconductor layer 1015 at the first side 1038, i.e. the drain, is electrically coupled to a high-side drain contact area 1040 at the second side 1021 via a high-side drain contact 1042 extending from the first n$^+$-type semiconductor layer 1015 at the first side 1038 through the first n-type epitaxial layer 1016 to the high-side drain contact area 1040 at the second side 1021.

The second n-type channel vertical FET 1060 includes an optional second n$^+$-type semiconductor layer 1065, e.g. an n$^+$-type silicon layer, and a second n-type epitaxial layer 1066 formed on the optional second n$^+$-type semiconductor layer 1065. The optional second n$^+$-type semiconductor layer 1065 may be a reminder of an n$^+$-type semiconductor substrate that has previously been partially removed by an appropriate process such as etching or grinding.

The second n-type channel vertical FET 1060 further includes p-type body regions 1068 arranged between trenches 1070 extending from the second side 1021 of the one semiconductor die 1001 into the second n-type epitaxial layer 1066. Within each one of the trenches 1070, a gate electrode 1072 is arranged and electrically insulated from surrounding conductive elements via an insulating structure 1074. The insulating structure 1074 may include one or a plurality of insulating parts such as a gate insulator 1076 arranged between the gate electrode 1072 and the body region 1078. A conductivity of a channel region adjoining to the gate insulator 1076 may be controlled by a voltage applied to the gate electrode 1072. Apart from the gate electrodes 1072, each of the trenches 1070 includes one field electrode 1078 below the gate electrode 1072. The field electrode 1078 is also surrounded by the insulating structure 1074. In the embodiment illustrated in FIG. 17, each trench 1070 includes one field electrode 1078. Other embodiments lack any field electrode within the trenches 1070 or may even include more than one field electrode, e.g. two, three, four or even more field electrodes. In the embodiment illustrated in FIG. 17, a termination trench 1070' is arranged in a peripheral area of the second n-type channel vertical FET 1060. The termination trench 1070' includes a termination field electrode 1078' surrounded by the insulating structure 1074. In the embodiment of FIG. 17, one termination trench 1070' and one termination field electrode 1078' are illustrated. According to other embodiments a different number of termination trenches and/or termination field electrodes per termination trench may be used. The termination trench 1070' and the termination field electrode 1078' may improve the voltage blocking capability in the peripheral region of the second n-type channel vertical FET 1060.

The second n-type channel vertical FET 1060 further includes n$^+$-type source regions 1080 at the second side 1021. The n$^+$-type source regions 1080 and the p-type body regions 1068 are electrically coupled to a low-side source contact area 1082 at the second side 1021 via active area contacts 1084 such as conductive plugs or conductive lines. The second n-type epitaxial layer 1066 constitutes a drift zone of the second n-type channel vertical FET 1060. The optional second n$^+$-type semiconductor layer 1065 functions as a drain of the second n-type channel vertical FET 1060. The second n$^+$-type semiconductor layer at the first side 1038, i.e. the drain, is electrically coupled to a common contact area 1086, e.g. a metal contact area, at the first side 1038. The common contact area 1086 at the first side 1038 is electrically coupled to the high-side source rewiring area 1032 at the second side 1021 via a rewiring portion 1046 and a rewiring contact 1044 extending from the first side 1038 to the second side 1021.

FIG. 17 includes a simplified schematic illustration of the rewiring portion 1046. The rewiring contact 1044 is electrically insulated from the first n-type epitaxial layer 1016 via a first dielectric layer 1048*a* adjoining to a first p-type layer 1049*a*. The rewiring contact 1044 is electrically insulated from the second n-type epitaxial layer 1066 via a second dielectric layer 1048*b* adjoining to a second p-type layer 1049*b*. A part of the first n$^+$-type semiconductor layer 1015 adjoins to the first p-type layer 1049*a* along a vertical direction from the first side 1038 to the second side 1021. A part of the second n$^+$-type semiconductor layer 1065 adjoins to the second p-type layer 1049*b* along the vertical direction from the first side 1038 to the second side 1021.

The gate electrodes 1022 of the first n-type channel vertical FET 1010 are electrically coupled to a high-side gate contact area at the second side 1021 of the one semiconductor die 1001 (not illustrated in FIG. 2) similar to the embodiment illustrated in FIG. 1. The gate electrodes 1072 of the second n-type vertical FET 1060 are also electrically coupled to a low-side gate contact area at the second side 1021 of the one semiconductor die 1001 (not illustrated in FIG. 2) similar to the embodiment illustrated in FIG. 1. The contact area of the gate electrodes 1022 of the first n-type channel vertical FET 1010, the contact area of the gate electrodes 1072 of the second n-type channel vertical FET 1060, the high-side drain contact area 1040 and the low-side source contact area 1082 are electrically separated from each other, respectively.

A first interlayer dielectric 1090 at the first side 1038 provides an electrical insulation between the metal layer 1036, i.e. drain of the first n-type vertical FET 1010 and the common contact area 1086. Similarly, a second interlayer dielectric 1092 provides an electrical insulation between the contact area of the gate electrodes 1022 of the first n-type channel vertical FET 1010, the contact area of the gate electrodes 1072 of the second n-type channel vertical FET 1060, the high-side drain contact area 1040 and the low-side source contact area 1082 at the second side 1021.

None of, several of or all of corresponding elements of the first and second n-type vertical channel FETs 1010, 1060 such as source regions 1030, 1080, body regions 1018, 1068, gate electrodes 1022, 1072, field electrodes 1028, 1078, first and second n-type epitaxial layers 1016, 1066 may be simultaneously formed by lithographic patterning of a respective layer or stack of layers.

Figure 18:
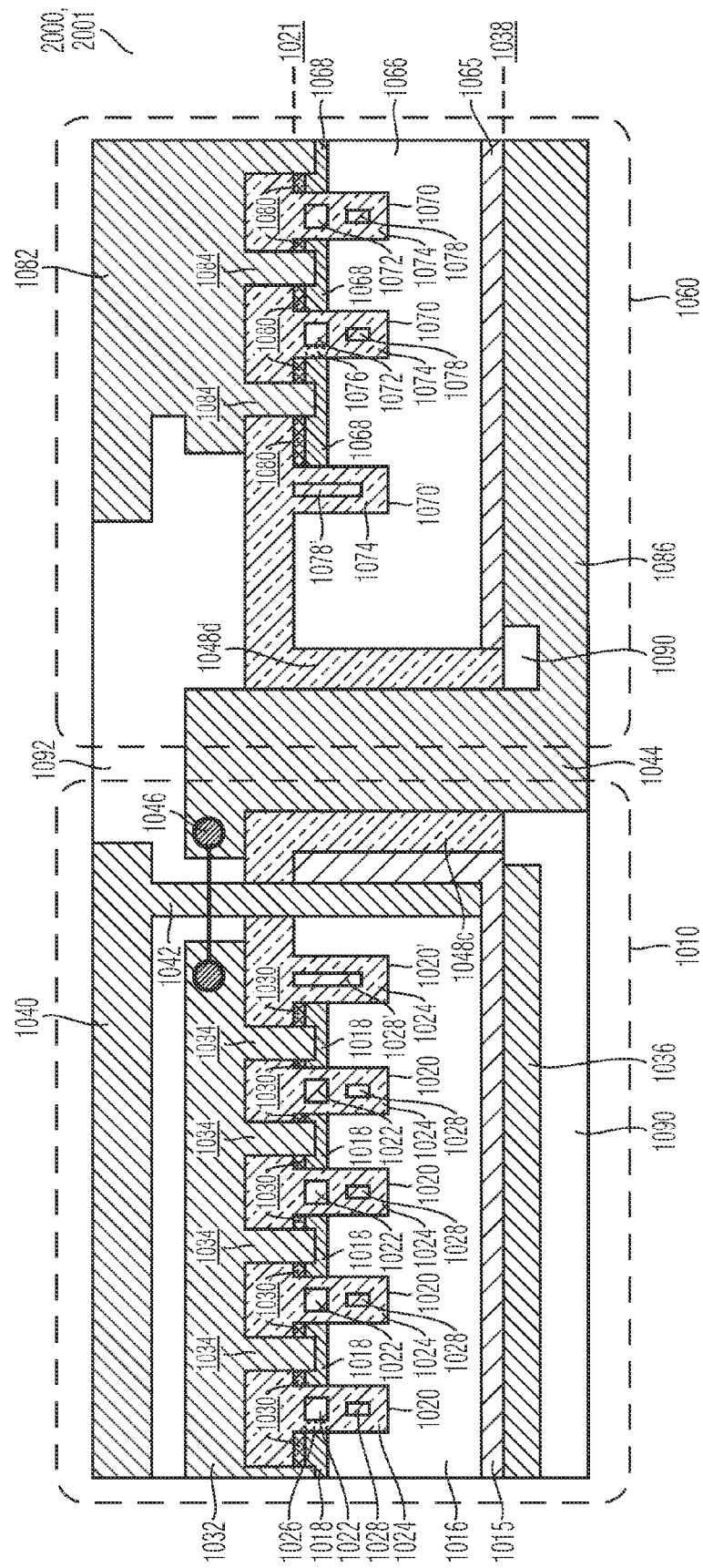
FIG. 18 illustrates a schematic cross-section of a portion of another embodiment of a semiconductor device including an n-type channel vertical FET high-side switch and an n-type channel vertical FET low-side switch and a contact electrically coupling a source of the high-side switch at a first side to a drain of the low-side switch at a second side opposite to the first side, wherein the contact is arranged between the high-side switch and the low-side switch.

FIG. 18 refers to a schematic cross-sectional view of a portion of another embodiment of a semiconductor device 2000 including one semiconductor die 2001, the one semiconductor die 2001 including a half-bridge configuration including a first n-type channel vertical FET 1010 as a high-side switch and a second n-type channel vertical FET 1060 as a low-side switch. Elements of the semiconductor device 2000 that correspond to elements of the semiconductor device 1000 illustrated in FIG. 17 are denoted with same reference numerals. The semiconductor device 2000 illustrated in FIG. 18 differs from the semiconductor device 1000 of the embodiment illustrated in FIG. 17 with regard to the electrical insulation between the rewiring contact 1044 and each of the first n-type epitaxial layer 1016 and the second n-type epitaxial layer 1066. Whereas, in the embodiment illustrated in FIG. 17, a first dielectric layer 1048*a* and a first p-type layer 1049*a* provide an electrical insulation between the rewiring contact 1044 and the first n-type epitaxial layer 1016 and, similarly, a second dielectric layer 1048*b* and a second p-type layer 1049*b* provide an electrical insulation between the rewiring contact 1044 and the second n-type epitaxial layer 1066, in the embodiment illustrated in FIG. 18, a first dielectric layer 1048*c* provides the electrical insulation between the rewiring contact 1044 and the first n-type epitaxial layer 1016 and a second dielectric layer 1048*d* provides the electrical insulation between the rewiring contact 1044 and the second n-type epitaxial layer 1066. The first and second dielectric layers 1048*a*, 1048*b* may differ from the first and second dielectric layers 1048*c*, 1048*d* with regard to shape and material(s).

Figure 19:
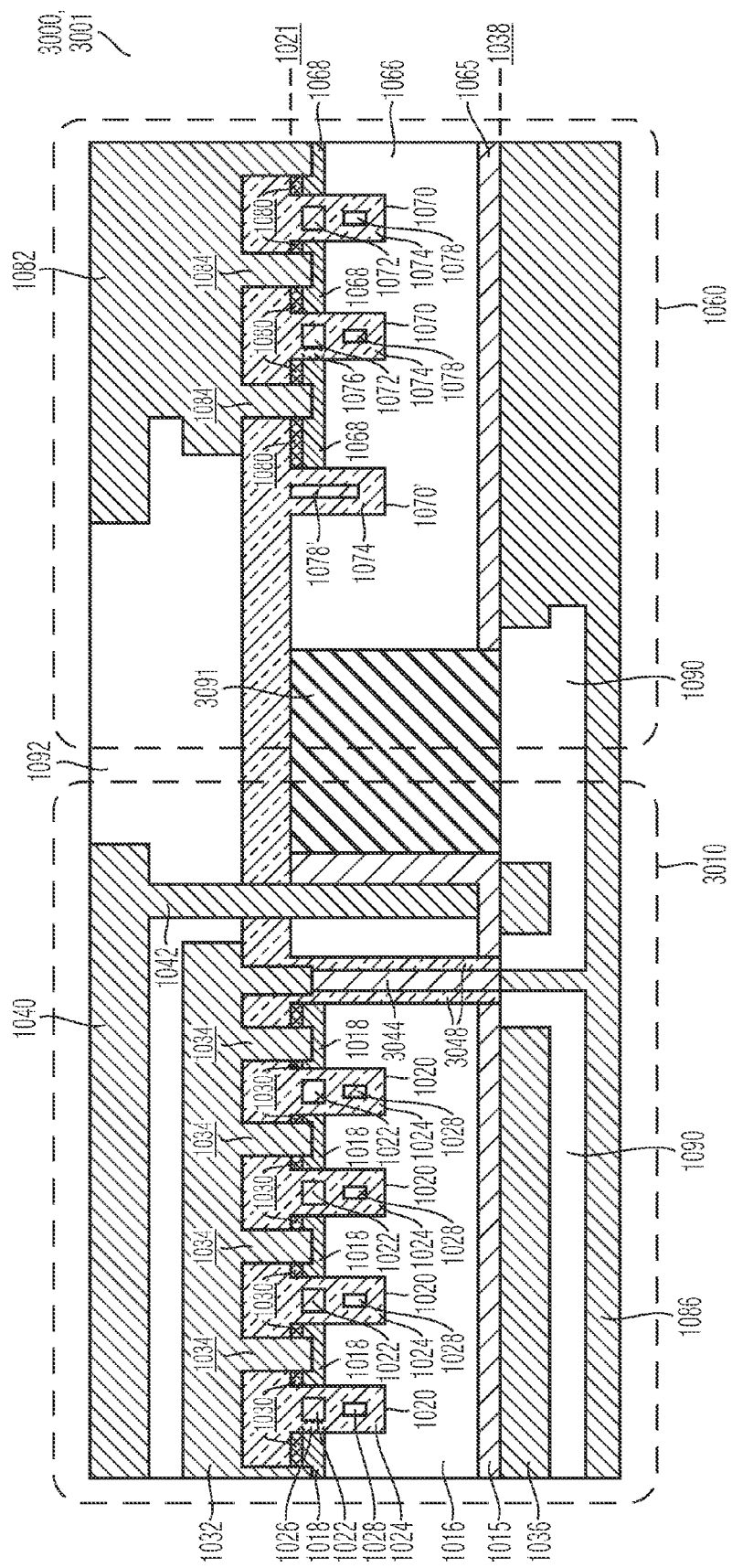
FIG. 19 illustrates a schematic cross-section of a portion of one embodiment of a semiconductor device including an n-type channel vertical FET high-side switch and an n-type channel vertical FET low-side switch and a contact electrically coupling a source of the high-side switch at a first side to a drain of the low-side switch at a second side opposite to the first side, wherein the contact is arranged in an area of the high-side switch.

FIG. 19 refers to a schematic cross-sectional view of a portion of another embodiment of a semiconductor device 3000 including one semiconductor die 3001, the one semiconductor die 3001 including a half-bridge configuration including a first n-type channel vertical FET 3010 as a high-side switch and a second n-type channel vertical FET 1060 as a low-side switch. Elements of the semiconductor device 3000 that correspond to elements of the semiconductor device 1000 illustrated in FIG. 17 are denoted with same reference numerals. In the semiconductor device 3000 illustrated in FIG. 19, an insulating region 3091 arranged between the first n-type channel vertical FET 3010 and the second n-type channel vertical FET 1060 provides an electrical insulation between the FETs 3010, 1060. According to one embodiment, the insulating region 3091 is a p-type region and the electrical insulation between the FETs 3010, 1060 is a pn junction insulation. According to another embodiment, the insulating region 3091 includes one or a plurality of dielectrics.

A rewiring contact 3044 extends from the first side 1038 to the second side 1021 through the first n-type epitaxial layer 1016 in a peripheral area of the FET 3010, i.e. the rewiring contact 3044 is arranged laterally between the insulating region 3091 and the gate electrodes 1022 and electrically couples the common contact area 1086 at the first side 1021 to the high-side source rewiring area 1032 at the second side 1021. The rewiring contact 3044 is electrically insulated from the first n-type epitaxial layer 1016 via a dielectric 3048. According to other embodiments the rewiring contact 3044 and the dielectric 3048 may extend from the first side 1038 to the second side 1021 through the second n-type epitaxial layer 1066 in a peripheral area of the FET 1060. In this case, the rewiring contact 3044 may be electrically coupled to the source rewiring area 1032 via a rewiring portion 3046 similar to the rewiring portion 1046 illustrated in FIG. 17.

Figure 20:
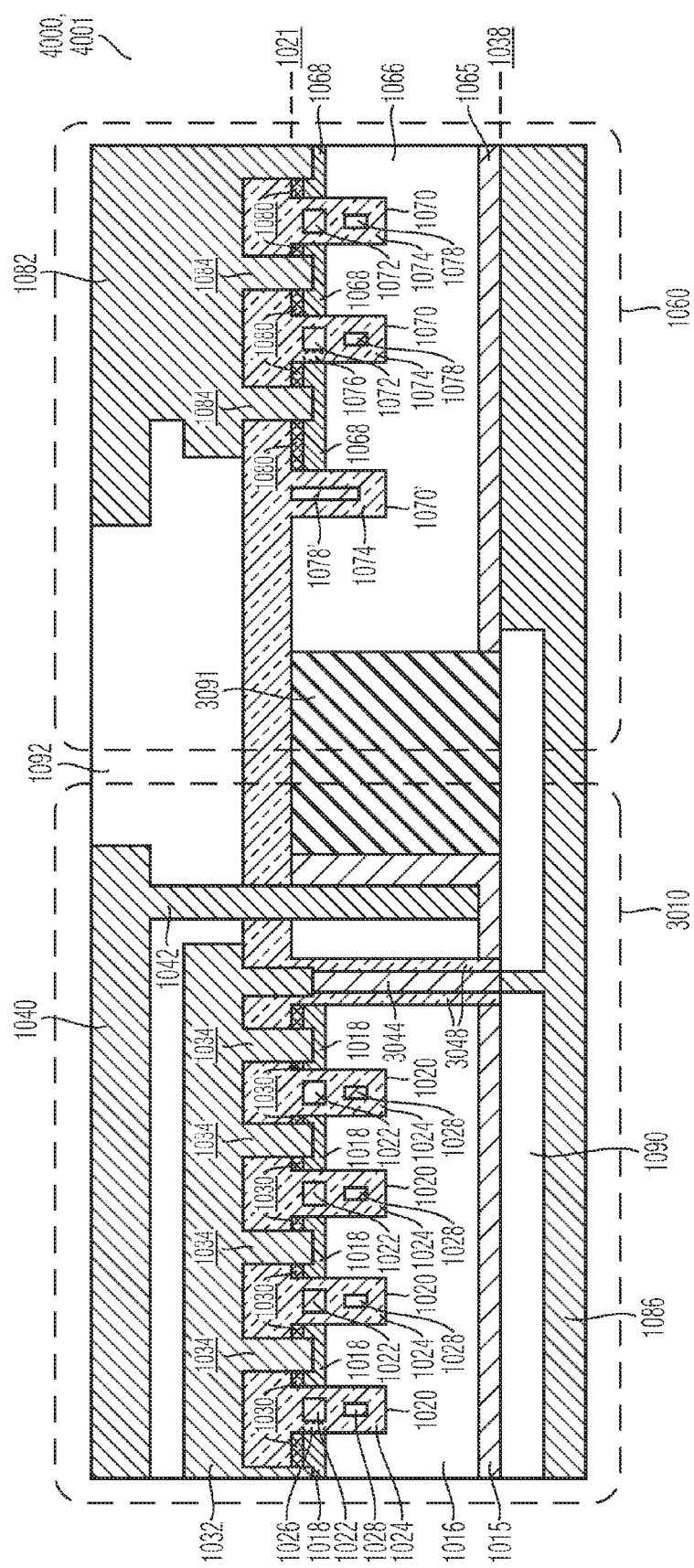
FIG. 20 illustrates a schematic view of a portion of another embodiment of a semiconductor device including an n-type channel vertical FET high-side switch and an n-type channel vertical FET low-side switch and a contact electrically coupling a source of the high-side switch at a first side to a drain of the low-side switch at a second side opposite to the first side, wherein the contact is arranged in an area of the high-side switch.

FIG. 20 refers to a schematic cross-sectional view of a portion of another embodiment of a semiconductor device 4000 including one semiconductor die 4001, the one semiconductor die 4001 including a half-bridge configuration including a first n-type channel vertical FET 3010 as a high-side switch and a second n-type channel vertical FET 1060 as a low-side switch. Elements of the semiconductor device 4000 that correspond to elements of the semiconductor device 3000 illustrated in FIG. 19 are denoted with same reference numerals. The semiconductor device 4000 differs from the embodiment illustrated in FIG. 19 in that the metal layer 1036 is missing.

FIG. 21 refers to the embodiment illustrated in FIG. 17 supplemented with a trench capacitor 1094 arranged within the one semiconductor die 1001. The trench capacitor 1094 includes a first capacitor electrode 1095 and a capacitor dielectric 1096 within a trench 1097. The capacitor dielectric 1096 is surrounded by a second capacitor electrode 1098. The second capacitor electrode 1098 is a doped semiconductor region. The first capacitor electrode 1095 is electrically coupled to the high-side drain contact area 1040 via a first rewiring portion 1101, e.g. a contact plug. The second capacitor electrode 1098 is electrically coupled to the low-side source contact area 1082 via a second rewiring portion 1102, e.g. a combination of a contact plug and a metal line. According to other embodiments, the trench capacitor 1094 is replaced by a capacitor different from a trench capacitor.

FIGS. 22A to 22E refer to a method of manufacturing a semiconductor device including a half-bridge configuration in one semiconductor die such as the one semiconductor dies 1001, 2001, 3001, 4001 illustrated in FIGS. 17, 18, 19 and 20.

Figure 22A:
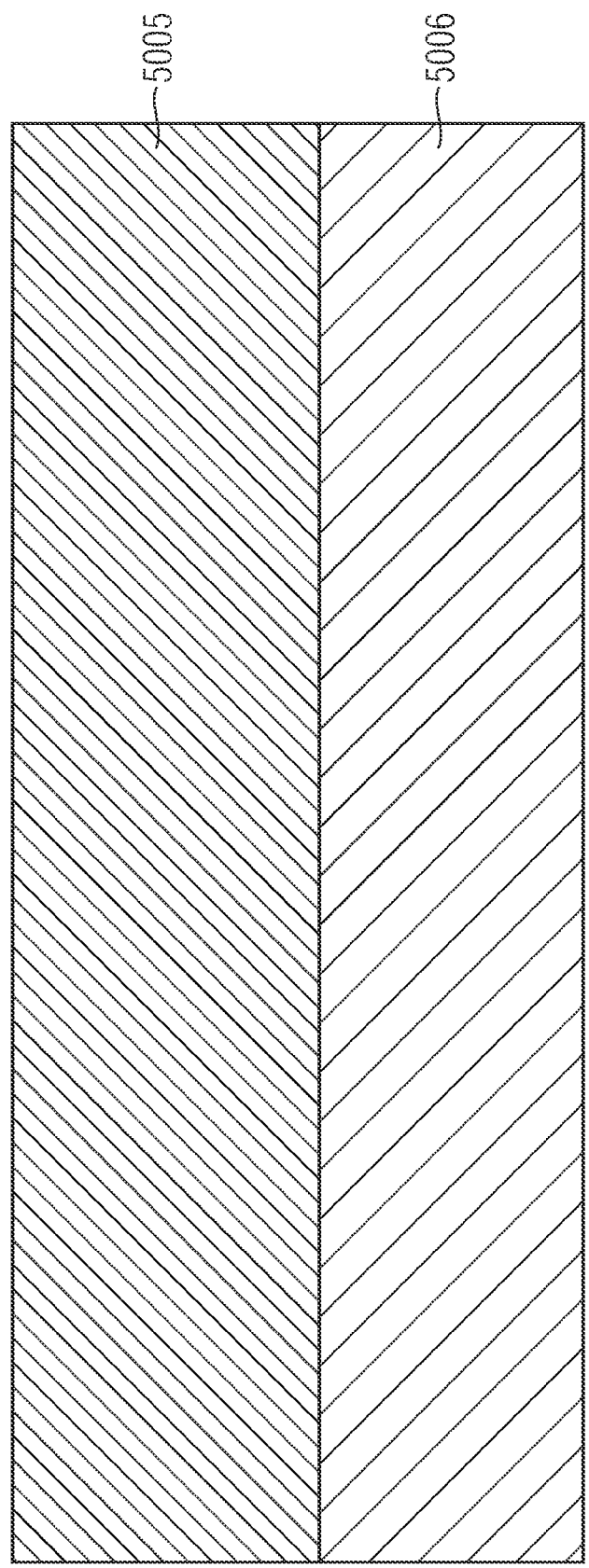

According to FIG. 22A, a separation layer 5005 for electrical insulation between drift zones of neighboring high-side and low-side switches are formed on a semiconductor substrate 5006, such a Si substrate. According to one embodiment, the separation layer 5005 is a dielectric layer such as a silicon oxide layer. According to another embodiment, the separation layer is a p-type semiconductor layer grown by epitaxy on an n$^+$-type Si substrate. The p-type semiconductor layer later constitutes part of a pn junction insulation.

Figure 22B:
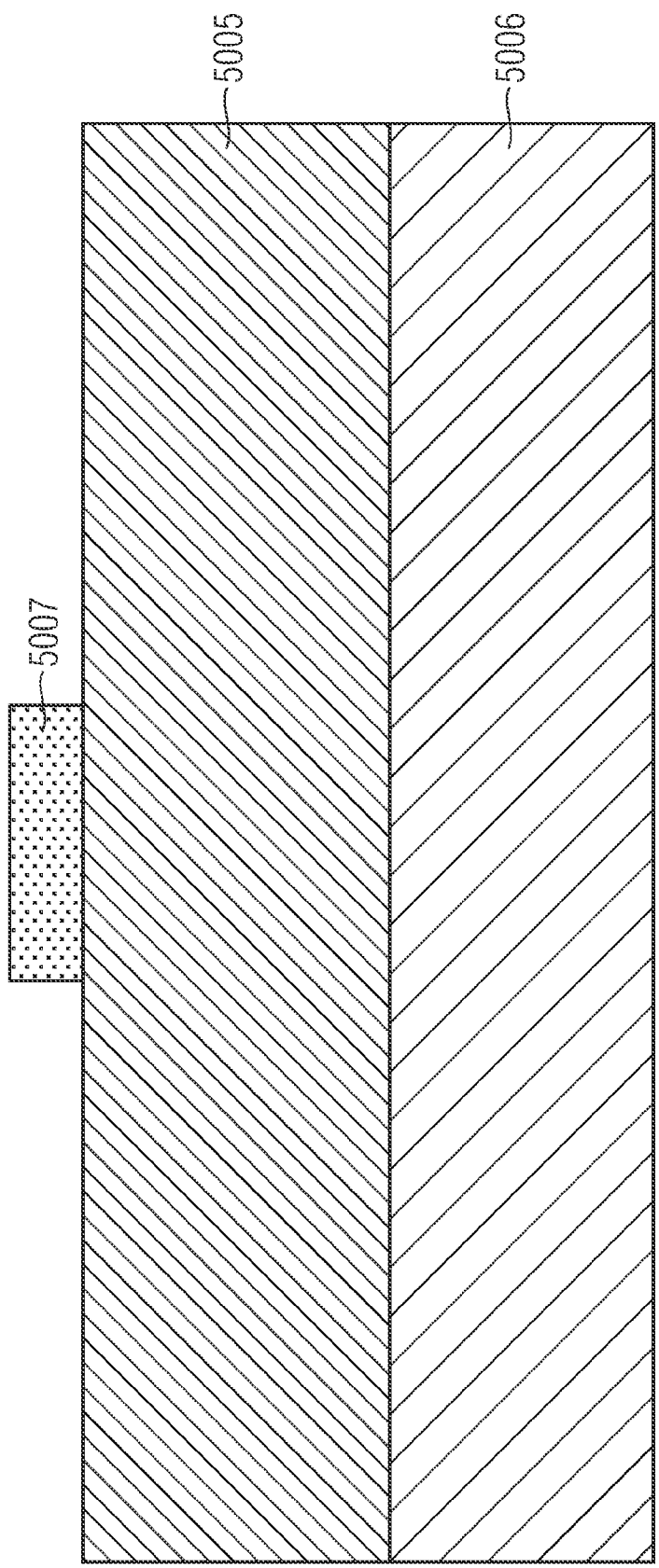

As illustrated in FIG. 22B, a patterned hardmask 5007 is formed on the separation layer 5005, e.g. by lithographic patterning of a continuous hardmask layer. The patterned hardmask may be a hard mask made of silicon oxide, e.g. in case of a separation layer 5005 made of p-type Si. Formation of the patterned hardmask 5007 may also be omitted, e.g. in case of a separation layer made of dielectric material such as silicon oxide.

Figure 22C:
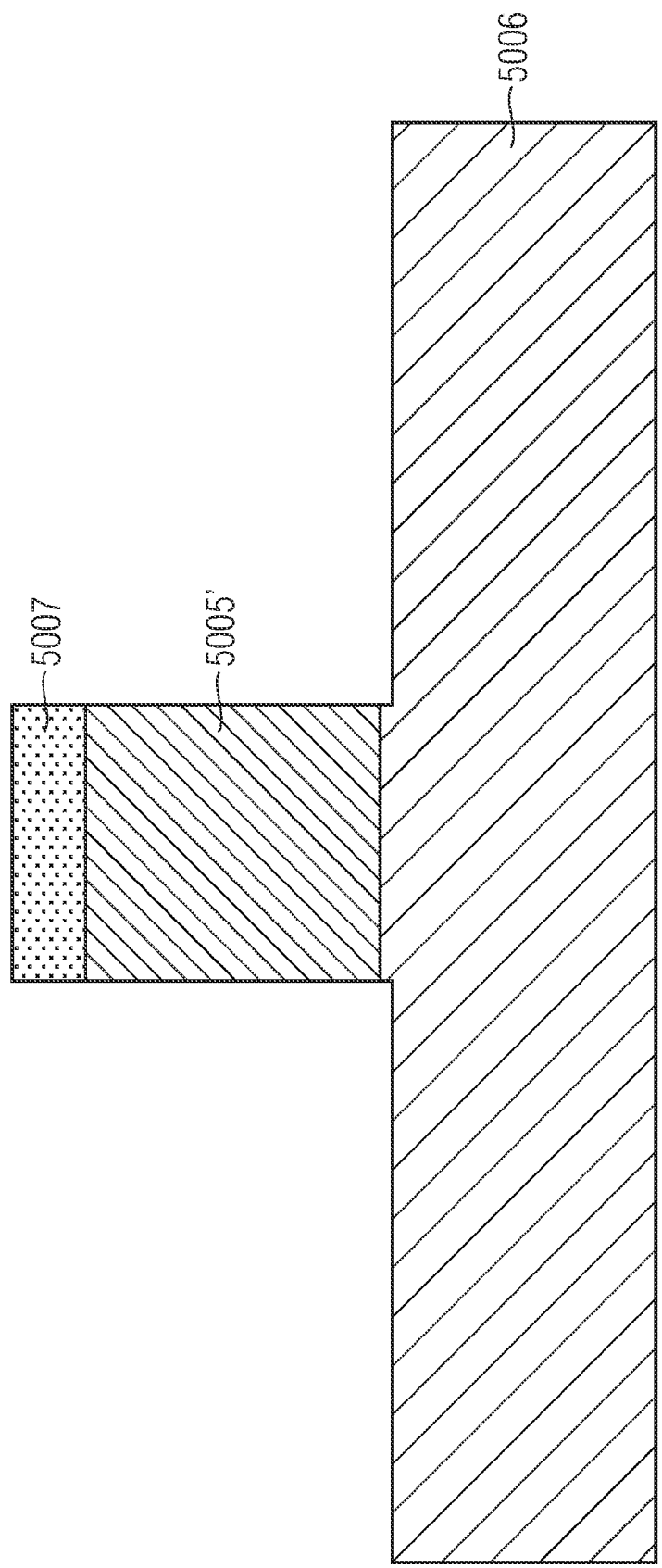
Figure 22D:
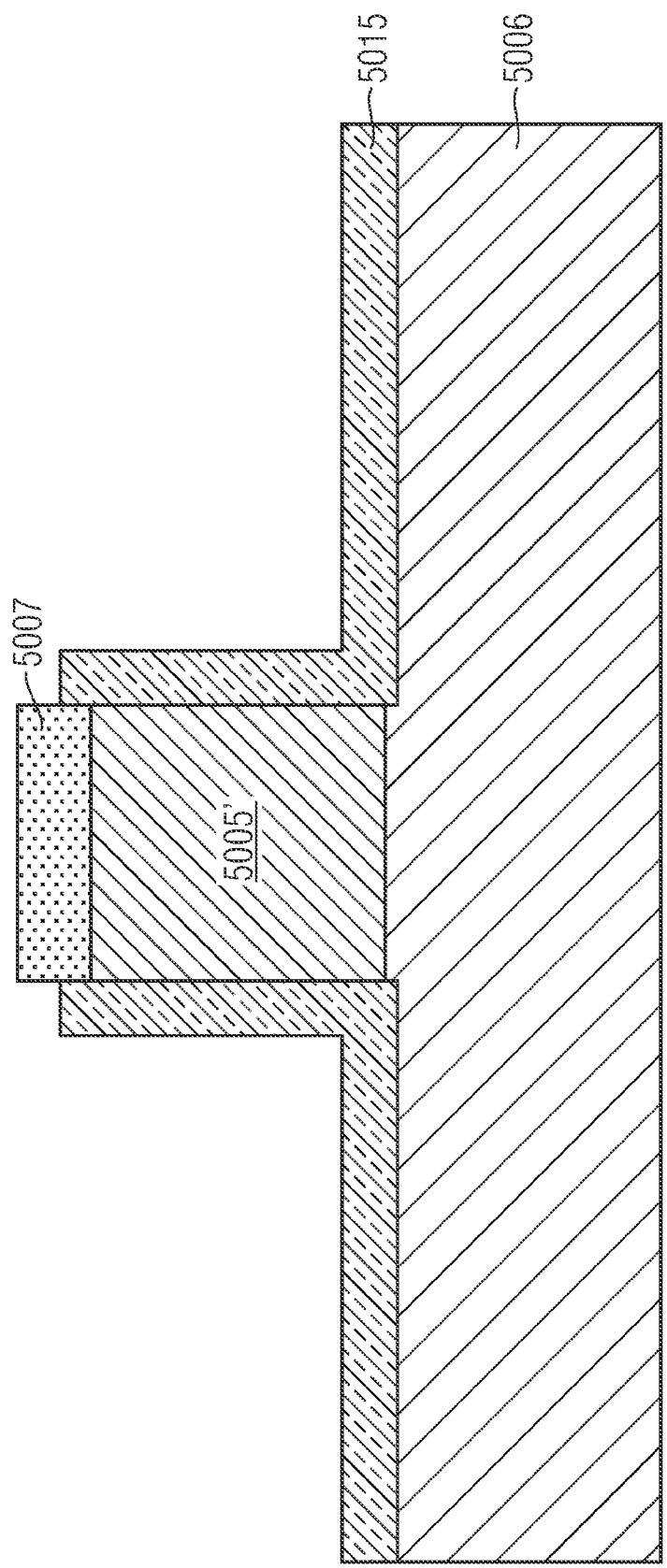

As illustrated in FIG. 22C, the separation layer 5005 is patterend using the patterned hardmask 5007 resulting in a patterned separation layer 5005' formed on the first layer 5005. The patterning of the separation layer 5005 may include dry etching or wet etching, for example Referring to FIG. 22D, a first n$^+$-type semiconductor layer 5015 is optionally formed on the semiconductor substrate 5006, e.g. by selective epitaxy. The first n$^+$-type semiconductor layer 5015 is also formed on sidewalls of the patterned separation layer 5005' in case the patterned separation layer 5005' is made of semiconductor material such as p-type Si. The first n$^+$-type semiconductor layer 5015 may also not be formed on the sidewalls of the patterned separation layer 5005' in case the patterned separation layer 5005' is made of dielectric material such as silicon oxide, for example. The first n$^+$-type semiconductor layer 5015 to the left of the patterned separation layer 5005' may also be formed before or after formation of the first n$^+$-type semiconductor layer 5015 to the right of the patterned separation layer 5005' by using a respective mask. The first n$^+$-type semiconductor layer 5015 may also be omitted to the right or to the let of the patterned separation layer 5005' by using a respective mask. This allows to adjust the parameters of these layers, e.g. impurity concentration and/or thickness, to the requirements of the devices to be formed in these areas, i.e. to the requirements of the low-side switch and the high-side switch.

Referring to FIG. 22E, a first n-type semiconductor layer 5016 is formed on the first n$^+$-type semiconductor layer 5015, e.g. by selective epitaxy. The first n-type semiconductor layer 5016 to the left of the patterned separation layer 5005' may also be formed before or after formation of the first n-type semiconductor layer 5016 to the right of the patterned separation layer 5005' by using a respective mask. This allows to adjust the parameters of these layers, e.g. impurity concentration and/or thickness, to the requirements of the devices to be formed in these areas, i.e. to the requirements of the low-side switch and the high-side switch.

Figure 22F:
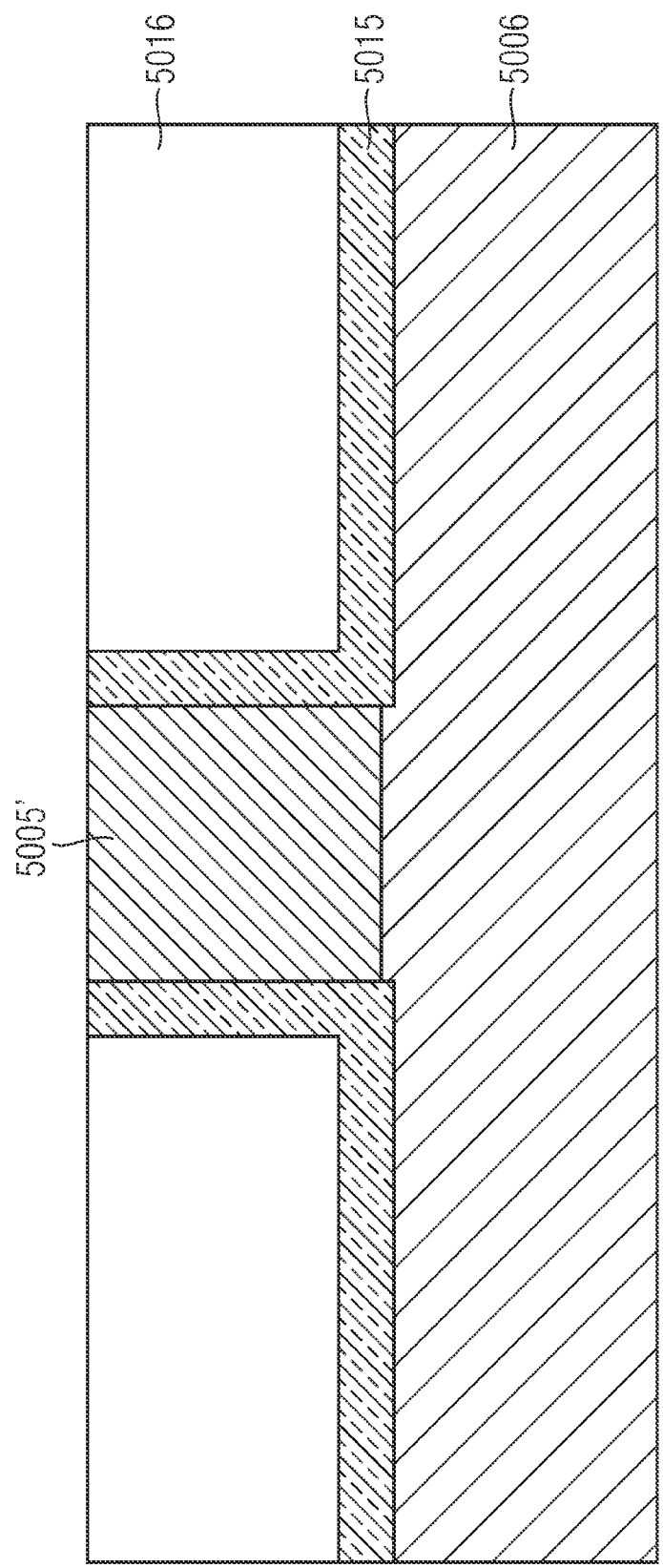

Referring to FIG. 22F, planarization, e.g. by chemical mechanical polishing (CMP), is carried out. Thereby, a patterned hard mask 5007 is removed and a desirable flat surface can be achieved.

The first n-type semiconductor layer 5016 may correspond to the layer 1016 illustrated in FIGS. 17, 18, 19, 20. The first n$^+$-type semiconductor layer 5015 may correspond to the layer 1015 illustrated in FIGS. 17, 18, 19, 20. The patterned separation layer 5005' may correspond to the insulating region 3091, 4091 illustrated in FIGS. 19 and 20. Further processes will be carried out to complete the devices illustrated in FIGS. 17, 18, 19, 20.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

The terms "+" and "−" used in conjunction with n- or p-type doping are relative terms of concentration of doping. The concentration of n$^+$-type doping is larger than the concentration of n-type doping and the concentration of n-type doping is larger than the concentration of n$^−$-type doping.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements.

It is to be understood that the features of the various embodiments described herein may be combined with each other, unless specifically noted otherwise. Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a semiconductor die having a first and a second side opposite each other, and comprising a first n-type channel FET and a second n-type channel FET;
   wherein a source of the first n-type channel FET and a drain of the second n-type channel FET are electrically coupled to at least one contact area at the first side of the semiconductor die;
   wherein a drain of the first n-type channel FET, a gate of the first n-type channel FET, a source of the second n-type channel FET and a gate of the second n-type channel FET are electrically coupled to contact areas at the second side of the one semiconductor die;
   wherein the contact areas of the drain of the first n-type channel FET, of the gate of the first n-type channel FET, of the source of the second n-type channel FET and of the gate of the second n-type channel FET are electrically separated from each other; and
   wherein the first FET is a lateral FET and the second FET is a trench FET and wherein an electrical connection from the contact area of the first FET at the first side to the source of the first FET includes a conductive plug.

2. The semiconductor device of claim 1, further comprising a Schottky diode connected in parallel to the source and the drain of the second n-type channel FET.

3. A semiconductor device comprising:

a semiconductor die having a first and a second side opposite each other, and comprising a first n-type channel FET and a second n-type channel FET;

wherein a source of the first n-type channel FET and a drain of the second n-type channel FET are electrically coupled to at least one contact area at the first side of the semiconductor die;

wherein a drain of the first n-type channel FET, a gate of the first n-type channel FET, a source of the second n-type channel FET and a gate of the second n-type channel FET are electrically coupled to contact areas at the second side of the one semiconductor die;

wherein the contact areas of the drain of the first n-type channel FET, of the gate of the first n-type channel FET, of the source of the second n-type channel FET and of the gate of the second n-type channel FET are electrically separated from each other; and wherein the first n-type channel FET and the second n-type channel FET are n-type channel trench FETs, and each of the first n-type channel FET and the second n-type channel FET includes p-type body regions being part of a p-type epitaxial layer formed above an n-type semiconductor substrate of the semiconductor die, and the p-type epitaxial layer is on the n-type semiconductor substrate.

4. A semiconductor device comprising:

one semiconductor die having a first and a second side opposite each other, and comprising a first p-type channel FET and a second n-type channel FET;

wherein a drain of the first p-type channel FET and a drain of the second n-type channel FET are electrically coupled to at least one contact area at the first side of the one semiconductor die;

wherein a source of the first p-type channel FET, a gate of the first p-type channel FET, a source of the second n-type channel FET and a gate of the second n-type channel FET are electrically coupled to contact areas at the second side of the one semiconductor die; and wherein the contact areas of the source of the first p-type channel FET, of the gate of the first p-type channel FET, of the source of the second n-type channel FET and of the gate of the second n-type channel FET are electrically separated from each other;

the semiconductor device further comprising a capacitor arranged above the first side of the one semiconductor die, the capacitor being electrically coupled between the contact area of the source of the first p-type channel FET and the contact area of the source of the second n-type channel FET at the second side of the one semiconductor die; and further comprising a capacitor arranged above the first side of the semiconductor die, the capacitor being electrically coupled between the contact area of the source of the first p-type channel FET and the contact area of the source of the second n-type channel FET at the second side of the semiconductor die.

* * * * *